United States Patent
Tsai

(10) Patent No.: US 11,264,474 B1
(45) Date of Patent: Mar. 1, 2022

(54) SEMICONDUCTOR DEVICE WITH BORON NITRIDE LAYER AND METHOD FOR FABRICATING THE SAME

(71) Applicant: NANYA TECHNOLOGY CORPORATION, New Taipei (TW)

(72) Inventor: Tzu-Ching Tsai, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/996,170

(22) Filed: Aug. 18, 2020

(51) Int. Cl.
*H01L 29/423* (2006.01)
*H01L 29/40* (2006.01)
*H01L 21/8234* (2006.01)
*H01L 29/06* (2006.01)
*H01L 21/762* (2006.01)

(52) U.S. Cl.
CPC .... *H01L 29/4236* (2013.01); *H01L 21/76224* (2013.01); *H01L 21/823481* (2013.01); *H01L 29/0649* (2013.01); *H01L 29/401* (2013.01)

(58) Field of Classification Search
CPC ....... H01L 21/76224; H01L 21/823481; H01L 29/0649; H01L 29/0642; H01L 29/4236
See application file for complete search history.

(56) References Cited

U.S. PATENT DOCUMENTS

| | | | | |
|---|---|---|---|---|
| 9,653,543 B2* | 5/2017 | Tilke | ................. | H01L 21/76229 |
| 10,262,890 B1* | 4/2019 | Xu | ...................... | H01L 21/2807 |
| 10,490,556 B1* | 11/2019 | Su | ....................... | H01L 21/0234 |
| 2002/0053715 A1* | 5/2002 | Kim | .................... | H01L 21/3086 257/524 |
| 2005/0277265 A1* | 12/2005 | Cha | .................... | H01L 21/76224 438/435 |
| 2009/0200635 A1* | 8/2009 | Koldiaev | .......... | H01L 21/32139 257/506 |
| 2009/0286402 A1* | 11/2009 | Xia | ...................... | H01L 21/3141 438/703 |
| 2011/0233513 A1* | 9/2011 | Dimitrakopoulos | ......................... | H01L 29/7781 257/9 |
| 2016/0293483 A1* | 10/2016 | Manna | .............. | H01L 21/76877 |
| 2019/0165103 A1* | 5/2019 | Lu | .......................... | H01L 29/778 |
| 2019/0371911 A1* | 12/2019 | Miao | ................... | H01L 29/0847 |
| 2020/0071566 A1* | 3/2020 | Park | ........................ | C09G 1/02 |

(Continued)

FOREIGN PATENT DOCUMENTS

| | | | | |
|---|---|---|---|---|
| CN | 104319257 A | * | 1/2015 | |
| CN | 104779284 B | * | 1/2019 | |
| WO | WO-2010059368 A1 | * | 5/2010 | ............. H01L 45/12 |

*Primary Examiner* — Joseph C. Nicely
(74) *Attorney, Agent, or Firm* — Muncy, Geissler, Olds & Lowe, P.C.

(57) ABSTRACT

The present application discloses a semiconductor device and a method for fabricating the semiconductor device. The semiconductor device includes a substrate, a pad oxide layer positioned on the substrate, a hard mask layer positioned on the pad oxide layer, an isolation layer positioned along the hard mask layer and the pad oxide layer and extending to the substrate, a first dielectric layer positioned between the substrate and the isolation layer, and a liner layer positioned on a top surface of the hard mask layer and positioned between the first dielectric layer and the isolation layer, between the pad oxide layer and the isolation layer, and between the hard mask layer and the isolation layer. The hard mask layer and the liner layer include boron nitride.

14 Claims, 19 Drawing Sheets

(56) References Cited

U.S. PATENT DOCUMENTS

| | | | |
|---|---|---|---|
| 2020/0135587 A1* | 4/2020 | Cheng | H01L 21/823878 |
| 2021/0202737 A1* | 7/2021 | Pan | H01L 29/66681 |
| 2021/0226042 A1* | 7/2021 | Hsiao | H01L 21/76224 |
| 2021/0242081 A1* | 8/2021 | Wu | H01L 29/785 |
| 2021/0249060 A1* | 8/2021 | Woo | H01L 43/02 |

* cited by examiner

SEMICONDUCTOR DEVICE WITH BORON NITRIDE LAYER AND METHOD FOR FABRICATING THE SAME

TECHNICAL FIELD

The present disclosure relates to a semiconductor device and a method for fabricating the semiconductor device, and more particularly, to a semiconductor device with the boron nitride layer and a method for fabricating the semiconductor device with the boron nitride layer.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate, a pad oxide layer positioned on the substrate, a hard mask layer positioned on the pad oxide layer, an isolation layer positioned along the hard mask layer and the pad oxide layer and extending to the substrate, a first dielectric layer positioned between the substrate and the isolation layer, and a liner layer positioned on a top surface of the hard mask layer and positioned between the first dielectric layer and the isolation layer, between the pad oxide layer and the isolation layer, and between the hard mask layer and the isolation layer. The hard mask layer and the liner layer include boron nitride.

In some embodiments, a thickness of the hard mask layer is between about 1 nm and about 10 nm.

In some embodiments, a thickness of the liner layer is between about 1 nm and about 10 nm.

In some embodiments, the semiconductor device includes covering layers positioned on the top surface of the liner layer and positioned between the isolation layer and the liner layer. Bottommost points of the covering layers are at a vertical level lower than a vertical level of a top surface of the substrate.

In some embodiments, a width of the covering layers gradually decreases from top to bottom.

In some embodiments, the covering layers are formed of aluminum oxide, hafnium oxide, zirconium oxide, titanium oxide, titanium nitride, tungsten nitride, silicon nitride, or silicon oxide.

In some embodiments, the semiconductor device includes a first barrier layer positioned between the first dielectric layer and the liner layer.

In some embodiments, the semiconductor device includes a second barrier layer positioned between the liner layer and the isolation layer.

In some embodiments, the first barrier layer and the second barrier layer are formed of silicon nitride.

Another aspect of the present disclosure provides a semiconductor device including a substrate, an isolation layer positioned in the substrate, a first dielectric layer positioned between the substrate and the isolation layer, and a liner layer positioned between the first dielectric layer and the isolation layer. A top surface of the isolation layer is substantially coplanar with a top surface of the substrate and the liner layer includes boron nitride.

Another aspect of the present disclosure provides a method for fabricating a semiconductor device including providing a substrate, forming a pad oxide layer on the substrate, forming a hard mask layer on the pad oxide layer, forming a first trench along the hard mask layer and the pad oxide layer and extending to the substrate, conformally forming a first dielectric layer in the first trench, conformally forming a liner layer on the first dielectric layer, and forming an isolation layer on the liner layer. The hard mask layer and the liner layer include boron nitride.

In some embodiments, the step of forming the hard mask layer on the pad oxide layer includes forming a boron-based layer on the pad oxide layer by a film formation process using first precursors, and turning the boron-based layer into the hard mask layer by reacting second precursors with the boron-based layer in a treatment process.

In some embodiments, the first precursors are diborane, borazine, or an alkyl-substituted derivative of borazine.

In some embodiments, the second precursors are ammonia or hydrazine.

In some embodiments, the treatment process includes introducing silicon-based precursors with the second precursors to react with the boron-based layer and the silicon-based precursors are silane, trisilylamine, trimethylsilane, and silazanes.

In some embodiments, the treatment process includes introducing phosphorus-based precursors with the second precursors to react with the boron-based layer and the phosphorus-based precursors are phosphine.

In some embodiments, the treatment process includes introducing oxygen-based precursors with the second precursors to react with the boron-based layer and the oxygen-based precursors are oxygen, nitric oxide, nitrous oxide, carbon dioxide, or water.

In some embodiments, a process pressure of the film formation process is between about 10 mTorr and about 760 Torr.

In some embodiments, a substrate temperature of the film formation process is between about 100° C. and about 1000° C.

In some embodiments, the film formation process is performed with plasma, the plasma is provided by a RF power between 30 W and 1000 W.

Due to the design of the semiconductor device of the present disclosure, the hard mask layer may be employed as an anti-reflection coating to improve the quality of patterning. Accordingly, the quality of the semiconductor device may be improved. In addition, the isolation layer may be formed without any void due to the presence of the covering layers. As a result, the reliability of the semiconductor device may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
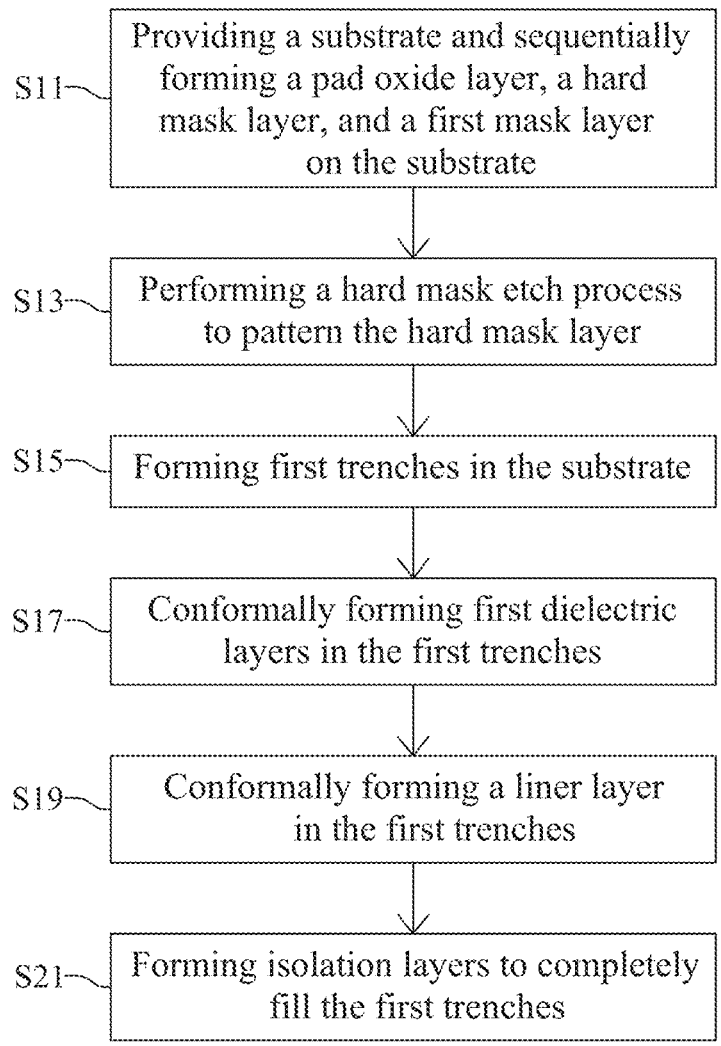
FIG. 1 illustrates, in a flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

It should be noted that, in the description of the present disclosure, a surface of an element (or a feature) located at the highest vertical level along the direction Z is referred to as a top surface of the element (or the feature). A surface of an element (or a feature) located at the lowest vertical level along the direction Z is referred to as a bottom surface of the element (or the feature).

It should be noted that the functions or steps noted herein may occur in an order different from the order noted in the figures. For example, two figures shown in succession may in fact be executed substantially concurrently or may sometimes be executed in a reversed order, depending upon the functionalities or steps involved.

It should be noted that the terms "forming," "formed" and "form" may mean and include any method of creating, building, patterning, implanting, or depositing an element, a dopant or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching and wet etching.

It should be noted that, the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

FIG. 1 illustrates, in a flowchart diagram form, a method 10 for fabricating a semiconductor device 1A in accordance with one embodiment of the present disclosure. FIGS. 2 to 7 illustrate, in schematic cross-sectional view diagrams, a flow for fabricating the semiconductor device 1A in accordance with one embodiment of the present disclosure.

Figure 2:
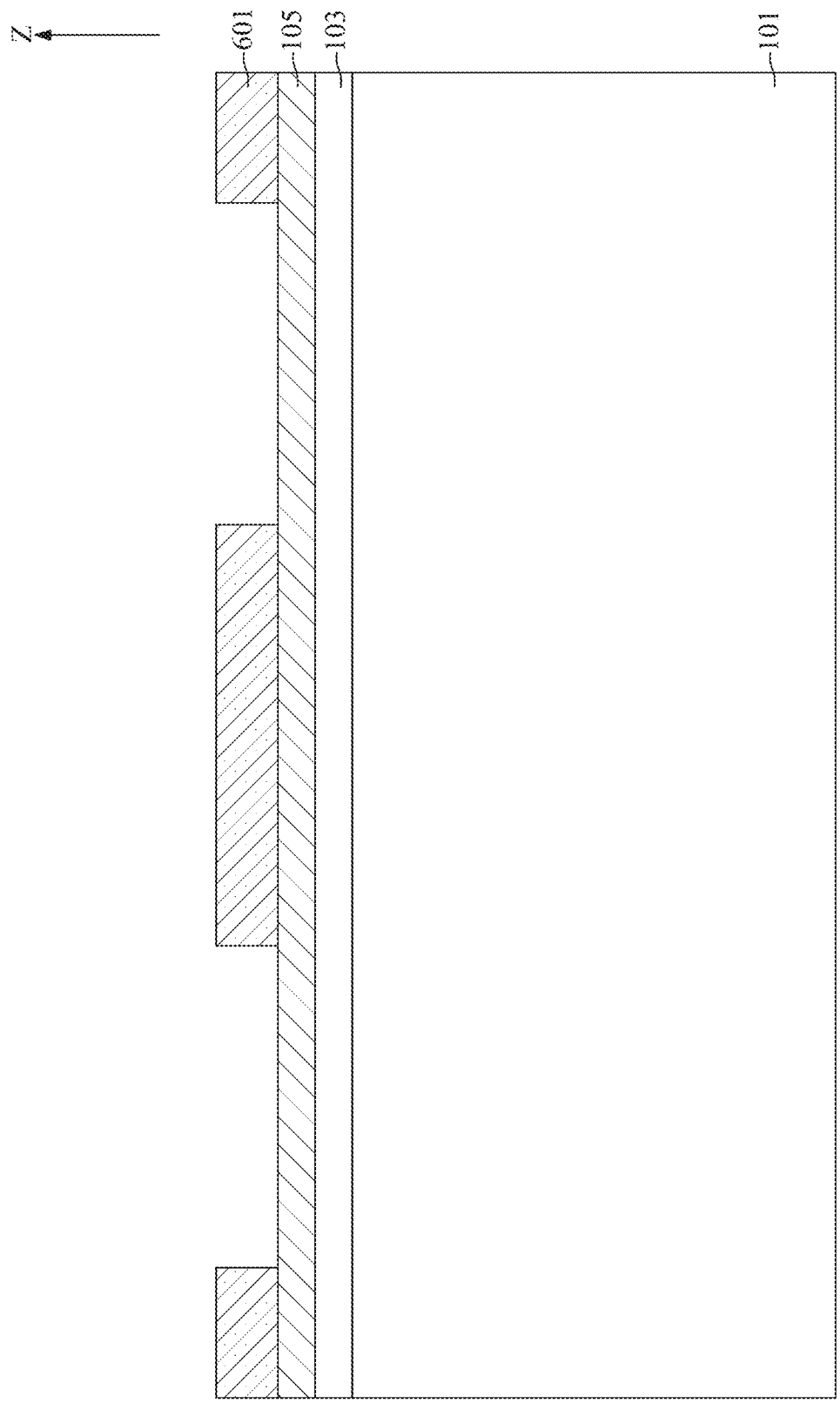
FIGS. 2 to 7 illustrate, in schematic cross-sectional view diagrams, a flow for fabricating the semiconductor device in accordance with one embodiment of the present disclosure.

With reference to FIGS. 1 and 2, at step S11, a substrate 101 may be provided and a pad oxide layer 103, a hard mask layer 105, and a first mask layer 601 may be sequentially formed on the substrate 101.

With reference to FIG. 1, the substrate 101 may be formed of, for example, silicon, germanium, silicon germanium, silicon carbon, silicon germanium carbon, gallium, gallium arsenide, indium arsenide, indium phosphorus or other IV-IV, III-V or II-VI semiconductor materials. In some embodiments, the substrate 101 may include an organic semiconductor or a layered semiconductor such as silicon/silicon germanium, silicon-on-insulator, or silicon germanium-on-insulator. When the substrate 101 is formed of silicon-on-insulator, the substrate 101 may include a top semiconductor layer and a bottom semiconductor layer formed of silicon, and a buried insulating layer which may separate the top semiconductor layer from the bottom semiconductor layer. The buried insulating layer may include, for example, a crystalline or non-crystalline oxide, nitride, or any combination thereof.

With reference to FIG. 2, the pad oxide layer 103 may be formed on the substrate 101. The pad oxide layer 103 may be formed of, for example, silicon oxide. The pad oxide layer 103 may be formed by a deposition process such as chemical vapor deposition.

With reference to FIG. 2, the hard mask layer 105 may be formed on the pad oxide layer 103. In some embodiments, the hard mask layer 105 may have a thickness between about 1 nm and about 10 nm. Specifically, the thickness of the hard mask layer 105 may be between about 2 nm and about 5 nm. In some embodiments, the hard mask layer 105 may be formed of, for example, boron nitride. In some embodiments, the hard mask layer 105 may be formed of, for example, boron nitride, silicon boron nitride, phosphorus boron nitride, or boron carbon silicon nitride.

In some embodiments, the hard mask layer 105 may be formed by a film formation process and a treatment process.

Specifically, in the film formation process, first precursors, which may be boron-based precursors, may be introduced over the pad oxide to form a boron-based layer. Subsequently, in the treatment process, second precursors, which may be nitrogen-based precursors, may be introduced to react with the boron-based layer and turn the boron-based layer into the hard mask layer 105.

In some embodiments, the first precursors may be, for example, diborane, borazine, or an alkyl-substituted derivative of borazine. In some embodiments, the first precursors may be introduced at a flow rate between about 5 sccm (standard cubic centimeters per minute) and about 50 slm (standard liter per minute); specifically, between about 10 sccm and about 1 slm. In some embodiments, the first precursors may be introduced by dilution gas such as nitrogen, hydrogen, argon, or a combination thereof. The dilution gas may be introduced at a flow rate between about 5 sccm and about 50 slm; specifically, between about 1 slm and about 10 slm.

In some embodiments, the film formation process may be performed without an assistant of plasma. In such situation, a substrate temperature of the film formation process may be between about 100° C. and about 1000° C. For example, the substrate temperature of the film formation process may be between about 300° C. and about 500° C. A process pressure of the film formation process may be between about 10 mTorr and about 760 Torr. For example, the process pressure of the film formation process may be between about 2 Torr and about 10 Torr.

In some embodiments, the film formation process may be performed in the presence of plasma. In such situation, a substrate temperature of the film formation process may be between about 100° C. and about 1000° C. For example, the substrate temperature of the film formation process may be between about 300° C. and about 500° C. A process pressure of the film formation process may be between about 10 mTorr and about 760 Torr. For example, the process pressure of the film formation process may be between about 2 Torr and about 10 Torr. The plasma may be provided by a RF power between 2 W and 5000 W. For example, the RF power of the plasma may be between 30 W and 1000 W.

In some embodiments, the second precursors may be, for example, ammonia or hydrazine. In some embodiments, the second precursors may be introduced at a flow rate between about 5 sccm and about 50 slm; specifically, between about 10 sccm and about 1 slm.

In some embodiments, oxygen-based precursors may be together introduced with the second precursors in the treatment process. The oxygen-based precursors may be, for example, oxygen, nitric oxide, nitrous oxide, carbon dioxide, or water.

In some embodiments, silicon-based precursors may be together introduced with the second precursors in the treatment process. The silicon-based precursors may be, for example, silane, trisilylamine, trimethylsilane, or silazanes (e.g., hexamethylcyclotrisilazane).

In some embodiments, phosphorus-based precursors may be together introduced with the second precursors in the treatment process. The phosphorus-based precursors may be, for example, phosphine.

In some embodiments, oxygen-based precursors, silicon-based precursors, or phosphorus-based precursors may be together introduced with the second precursors in the treatment process.

In some embodiments, the treatment process may be performed with an assistant of a plasma process, an UV cure process, a thermal anneal process, or a combination thereof.

When the treatment is performed with the assistant of the plasma process. Plasma of the plasma process may be provided by the RF power. In some embodiments, the RF power may be between about 2 W and about 5000 W at a single low frequency of between about 100 kHz up to about 1 MHz. In some embodiments, the RF power may be between about 30 W and about 1000 W at a single high frequency of greater than about 13.6 MHz. In such situation, a substrate temperature of the treatment process may be between about 20° C. and about 1000° C. A process pressure of the treatment process may be between about 10 mTorr and about 760 Torr.

When the treatment is performed with the assistant of UV cure process, in such situation, a substrate temperature of the treatment process may be between about 20° C. and about 1000° C. A process pressure of the treatment process may be between about 10 mTorr and about 760 Torr. The UV cure may be provided by any UV source, such as mercury microwave arc lamps, pulsed xenon flash lamps, or high-efficiency UV light emitting diode arrays. The UV source may have a wavelength of between about 170 nm and about 400 nm. The UV source may provide a photon energy between about 0.5 eV and about 10 eV; specifically, between about 1 eV and about 6 eV. The assistant of the UV cure process may remove hydrogen from the hard mask layer 105. As hydrogen may diffuse through into other areas of the semiconductor device 1A and may degrade the reliability of the semiconductor device 1A, the removal of hydrogen by the assistant of UV cure process may improve the reliability of the semiconductor device 1A. In addition, the UV cure process may increase the density of the hard mask layer 105.

When the treatment is performed with the assistant of the thermal anneal process. In such situation, a substrate temperature of the treatment process may be between about 20° C. and about 1000° C. A process pressure of the treatment process may be between about 10 mTorr and about 760 Torr.

With reference to FIG. 2, the first mask layer 601 may be formed on the hard mask layer 105. The first mask layer 601 may be, for example, a photoresist layer. The first mask layer 601 may be patterned to define the positions of first trenches 603 as will be illustrated later. During the patterning of the first mask layer 601, the hard mask layer 105 may serve as an anti-reflection coating to improve the quality of image transferring from a photomask to the first mask layer 601.

Figure 3:
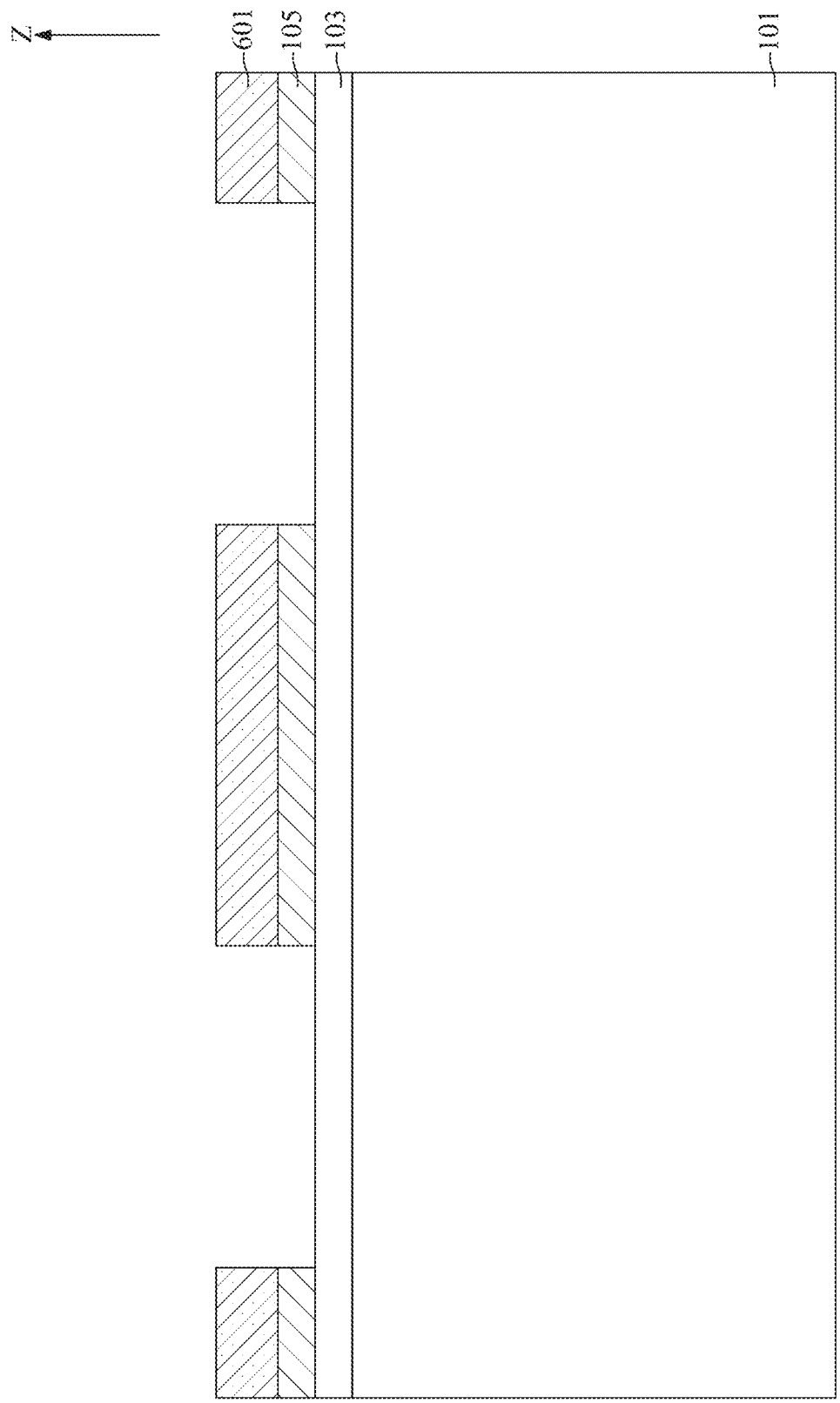

With reference to FIGS. 1 and 3, at step S13, a hard mask etch process may be performed to pattern the hard mask layer 105.

With reference to FIG. 3, the hard mask etch process may be performed to remove portions of the hard mask layer 105 and the pattern of the first mask layer 601 may be transfer to the hard mask layer 105. The etch rate of the hard mask layer 105 of the hard mask etch process may be faster than the etch rate of the pad oxide layer 103 of the hard mask etch process. For example, an etch rate ratio of the hard mask layer 105 to the pad oxide layer 103 may be between about 100:1 and about 1.05:1 during the hard mask etch process. For another example, the etch rate ratio of the hard mask layer 105 to the pad oxide layer 103 may be between about 100:1 and about 10:1 during the hard mask etch process.

Figure 4:
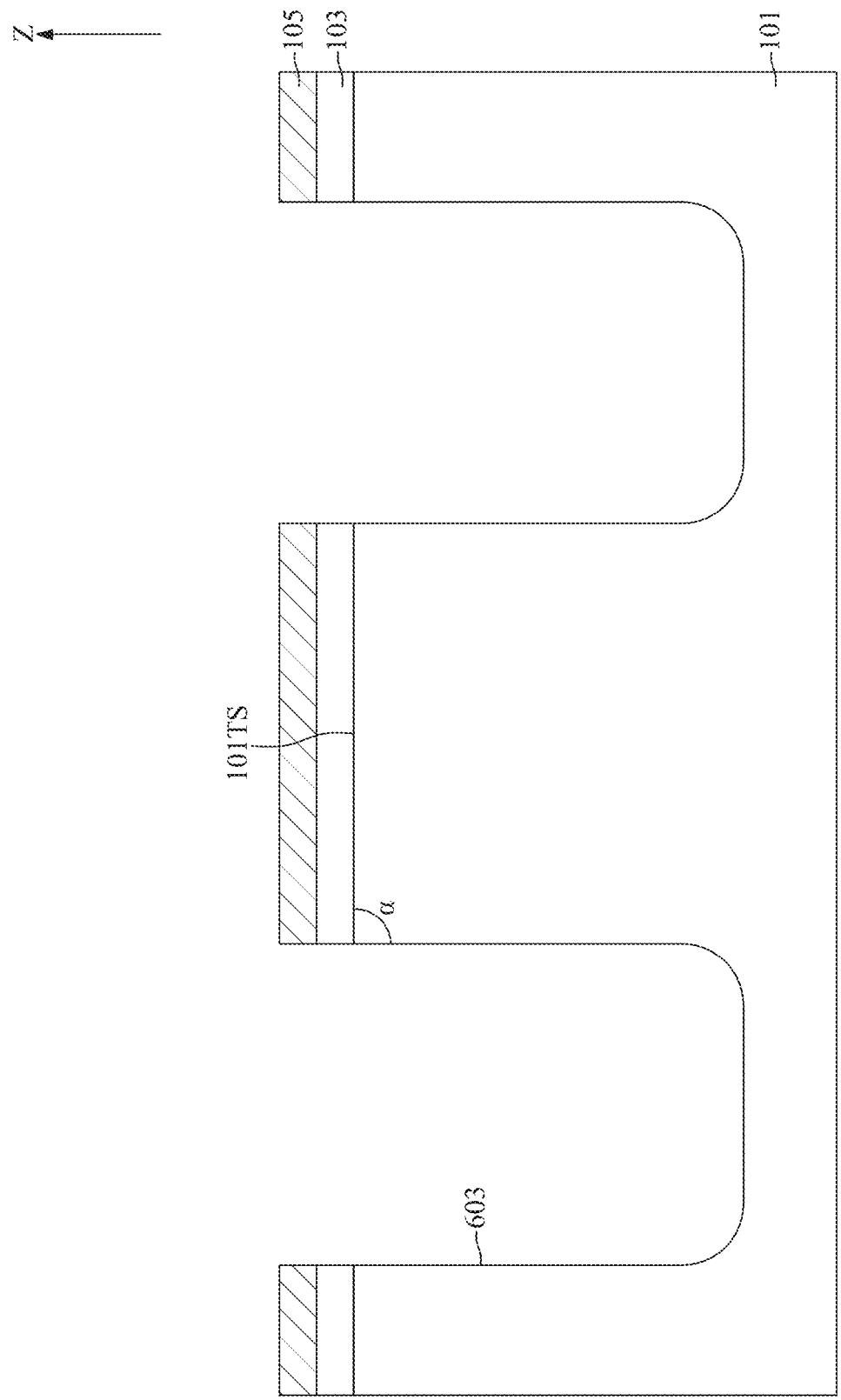

With reference to FIGS. 1 and 4, at step S15, first trenches 603 may be formed in the substrate 101.

With reference to FIG. 4, a trench etch process may be performed to remove portions of the pad oxide layer 103 and portions of the substrate 101. After the trench etch process, the first trenches 603 may be concurrently formed in the substrate 101. The trench etch process may be a multi-step etch process including, for example, a first etch process and a second etch process.

The etch rate of the pad oxide layer 103 of the first etch process may be faster than the etch rate of the substrate 101 of the first etch process. For example, an etch rate ratio of the pad oxide layer 103 to the substrate 101 may be between about 100:1 and about 1.05:1 during the first etch process. For another example, the etch rate ratio of the pad oxide layer 103 to the substrate 101 may be between about 20:1 and about 10:1 during the first etch process.

The etch rate of the substrate 101 of the second etch process may be faster than the etch rate of the hard mask layer 105 of the second etch process. For example, an etch rate ratio of the substrate 101 to the hard mask layer 105 may be between about 100:1 and about 1.05:1 during the second etch process. For another example, the etch rate ratio of the substrate 101 to the hard mask layer 105 may be between about 100:1 and about 20:1 during the second etch process.

With reference to FIG. 4, in some embodiments, the first trenches 603 may have an aspect ratio between about 1:6 and about 1:12. In some embodiments, the bottom surfaces of the first trenches 603 may be rounded. When the first trenches 603 have rounded bottom surfaces, corner effect may be avoided. In some embodiments, the bottom surfaces of the first trenches 603 may be flat. In some embodiments, the sidewalls of the first trenches 603 may be substantially vertical. In some embodiments, the sidewalls of the first trenches 603 may be tapered. An angle α between the sidewalls of the first trenches 603 and the top surface 101TS of the substrate 101 may be between 90 degree and about 100 degree.

It should be noted that a surface is "vertical" if there exists a vertical plane from which the surface does not deviate by more than three times the root mean square roughness of the surface.

Figure 5:
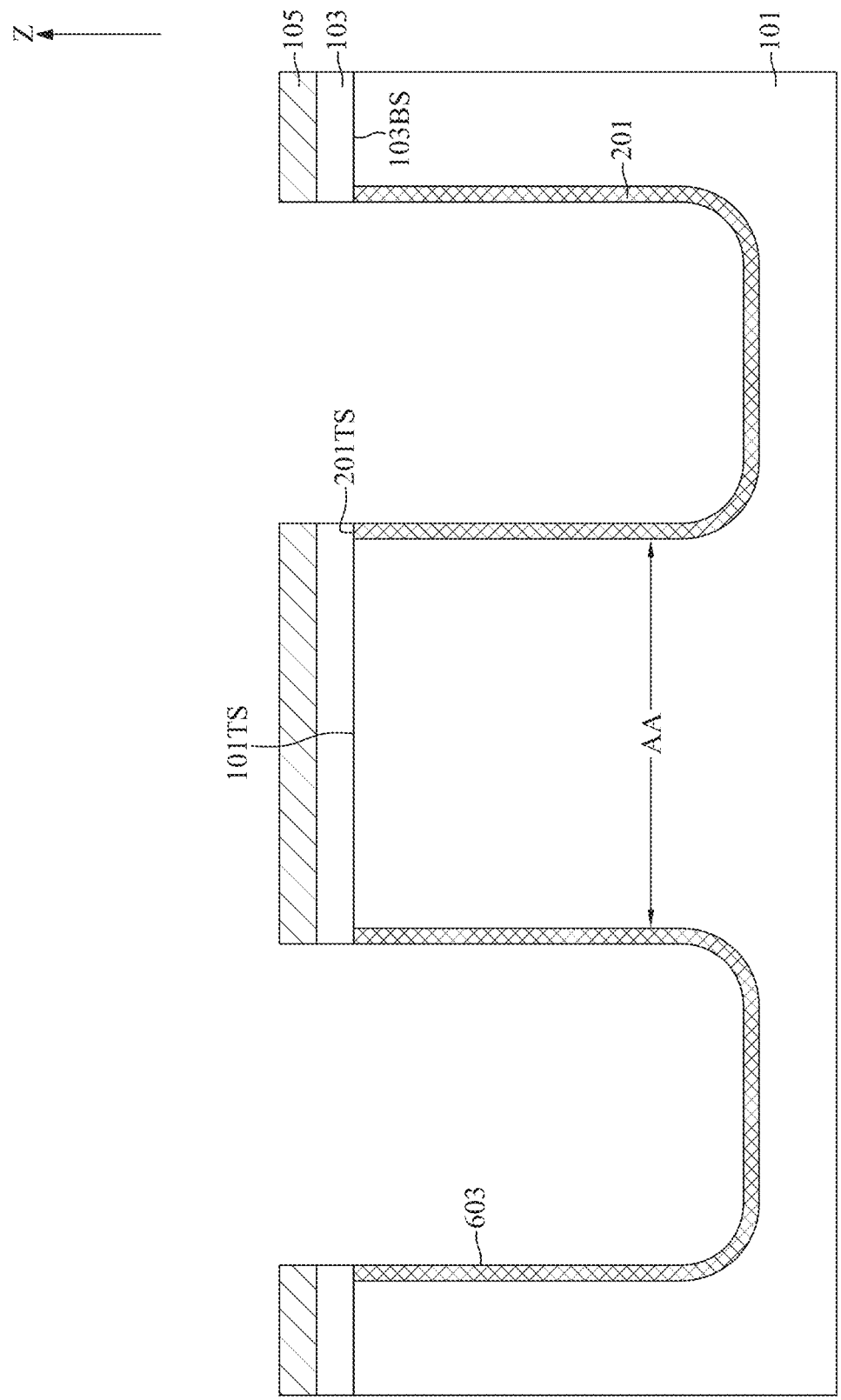

With reference to FIGS. 1 and 5, at step S17, first dielectric layers 201 may be conformally formed in the first trenches 603.

With reference to FIG. 5, the first dielectric layers 201 may be formed of, for example, silicon oxide. The first dielectric layers 201 may be formed by performing a rapid thermal oxidation to the intermediate semiconductor device illustrated in FIG. 4 in an oxide/oxynitride atmosphere. A temperature of the rapid oxidation may be about 1000° C. During the rapid thermal oxidation, portions of the substrate 101 exposed through the first trenches 603 may be oxidized and may be turned into the first dielectric layers 201. The top surfaces 201TS of the first dielectric layers 201 may be substantially coplanar with the top surface 101TS of the substrate 101. The top surface 201TS of the first dielectric layers 201 may contact the bottom surface 103BS of the pad oxide layer 103.

With reference to FIG. 5, the first trenches 603 and the first dielectric layers 201 may together define an active area AA in the substrate 101. A device element may be disposed in the active area AA or on the active area AA. The device element may be bipolar junction transistor, metal-oxide-semiconductor field effect transistor, diode, system large-scale integration, flash memories, dynamic random-access memory, static random-access memory, electrically erasable programmable read-only memory, image sensor, micro-electro-mechanical system, active device, or passive device but are not limited thereto. For example, the device element may be a buried word line of the dynamic random-access memory and may be disposed in the active area AA. For another example, the device element may be a gate structure of the metal-oxide-semiconductor field effect transistor and may be disposed on the active area AA.

Figure 6:
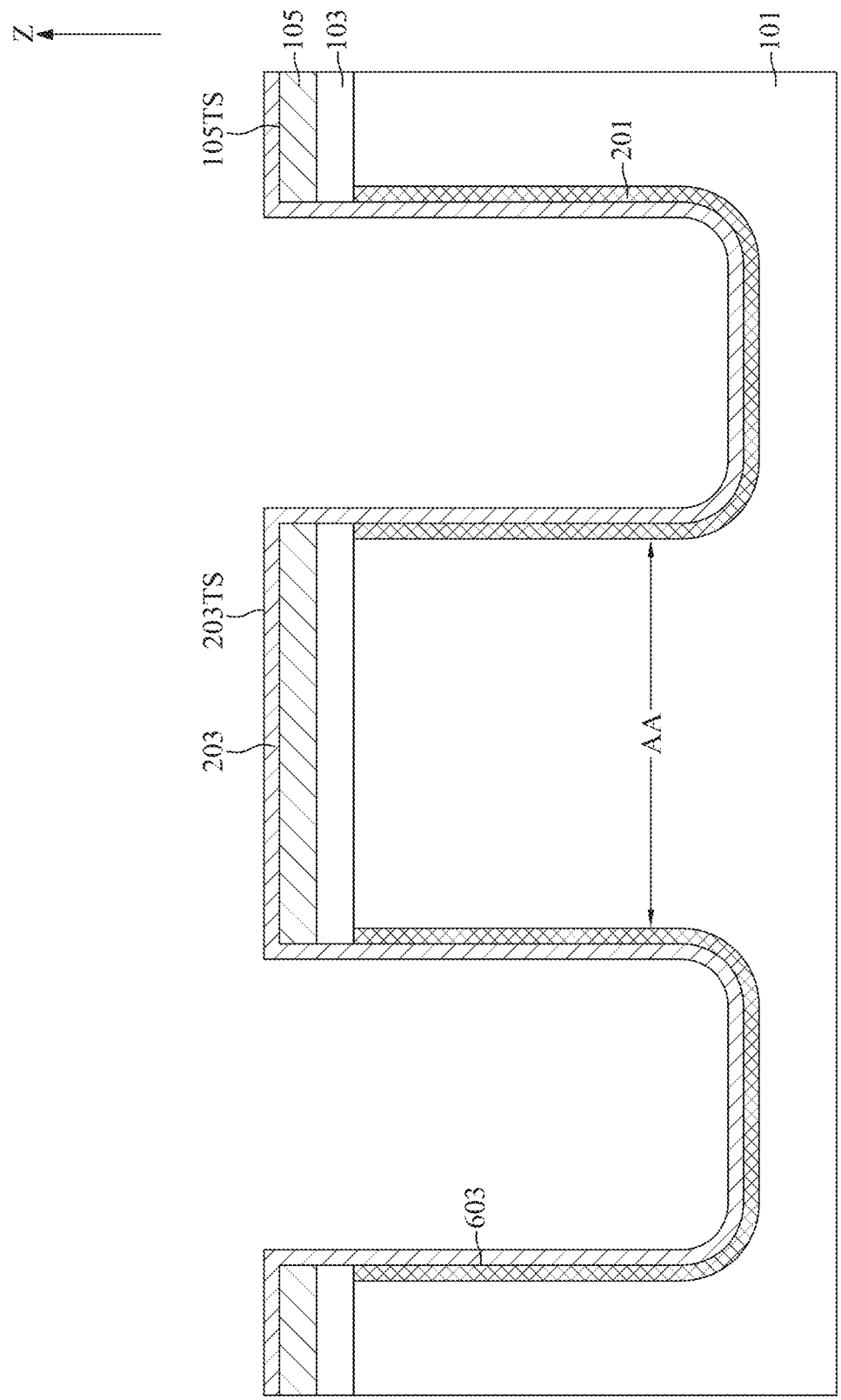

With reference to FIGS. 1 and 6, at step S19, a liner layer 203 may be conformally formed in the first trenches 603.

With reference to FIG. 6, the liner layer 203 may be conformally formed in the first trenches 603 and on the top surface 105TS of the hard mask layer 105. In some embodiments, the liner layer 203 may have a thickness between about 1 nm and about 10 nm. Specifically, the thickness of the liner layer 203 may be between about 2 nm and about 5 nm. In some embodiments, the liner layer 203 may be formed of, for example, boron nitride. In some embodiments, the liner layer 203 may be formed of, for example, boron nitride, silicon boron nitride, phosphorus boron nitride, or boron carbon silicon nitride. The hard mask layer 105 and the liner layer 203 formed on the top surface 105TS of the hard mask layer 105 together form a boron-nitride-composite structure. The thickness of the boron-nitride-composite structure may be greater than the liner layer 203 formed in the first trenches 603.

The liner layer 203 may be formed with a procedure similar to the hard mask layer 105 illustrated in the FIG. 2. Specifically, the liner layer 203 may be formed by a film formation process and a treatment process. In the film formation process, first precursors, which may be boron-based precursors, may be introduced over the intermediate semiconductor device illustrated in FIG. 5 to form a boron-based layer. Subsequently, in the treatment process, second precursors, which may be nitrogen-based precursors, may be introduced to react with the boron-based layer and turn the boron-based layer into the liner layer 203.

Figure 7:
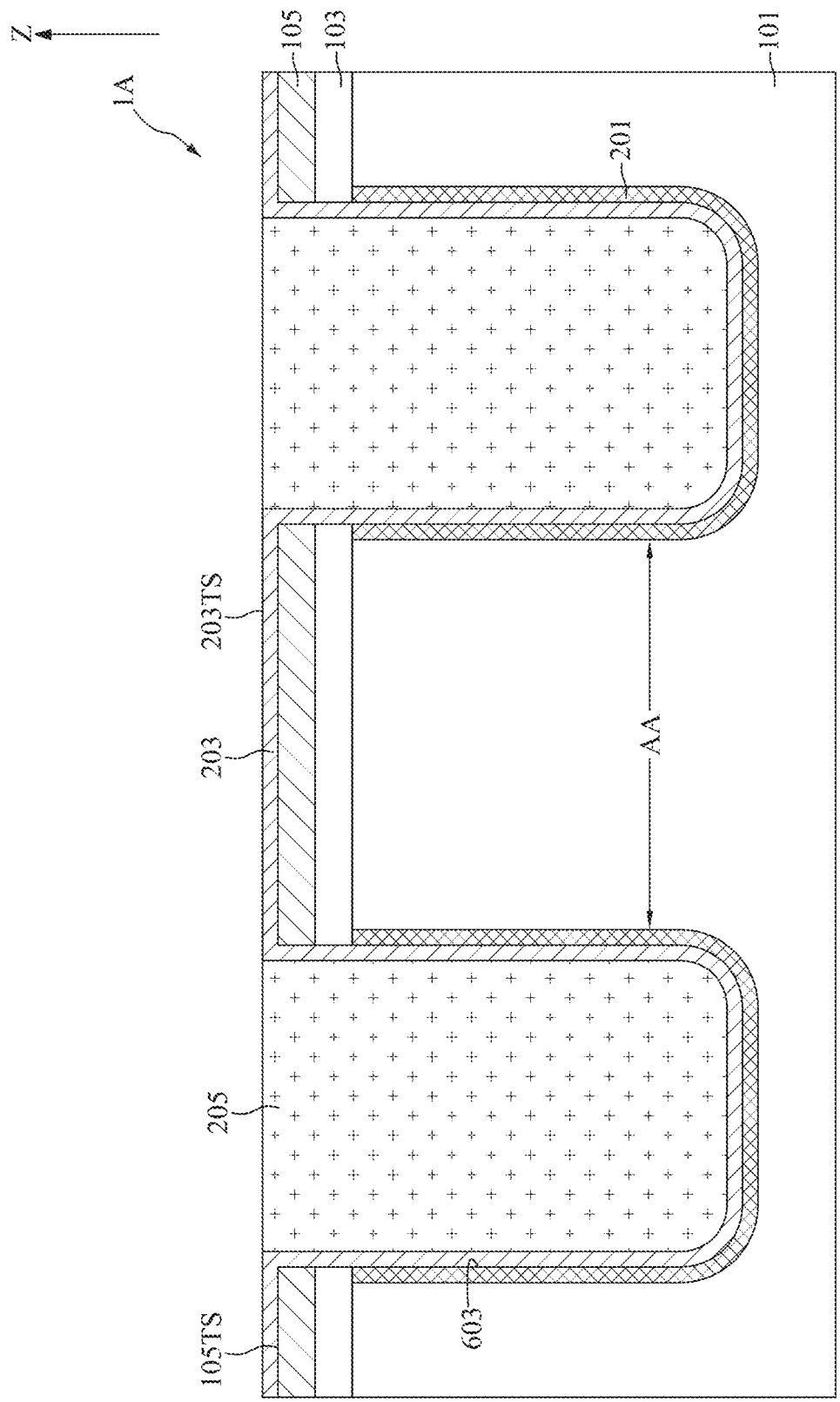

With reference to FIGS. 1 and 7, at step S21, isolation layers 205 may be formed to completely fill the first trenches 603.

With reference to FIG. 7, a high aspect ratio process may be performed to deposit a layer of isolation material to completely fill the first trenches 603 and cover the top surface 203TS of the liner layer 203. The isolation material may be, for example, silicon oxide, silicon nitride, silicon oxynitride, silicon nitride oxide, or fluoride-doped silicate.

It should be noted that, in the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

The high aspect ratio process may include a first stage and a second stage. The first stage may have a low deposition rate to ensure a more even trench fill with a reduced chance of forming voids. The second stage may have a rapid deposition rate to increase overall production efficiency by decreasing the deposition time. The high aspect ratio process may include both a slower deposition rate stage when the slower deposition rate is advantageous for reducing defects, and a higher deposition rate stage when the high deposition rate results in shorter deposition times.

In some embodiments, the pressure of the high aspect ratio process may be between about 200 Torr and about 760 Torr. In some embodiments, the temperature of the high aspect ratio process may be between about 400° C. and about 570° C.

In some embodiments, a two stage anneal may be performed after the high aspect ratio process. The first stage of the two stage anneal may be proceeded at a lower temperature in an environment that includes one or more oxygen containing species such as water, oxygen, nitric oxide, or nitrous oxide. The first stage of the two stage anneal may rearrange and strengthen the silicon oxide network to prevent the formation of voids and opening of weak seams in the first trenches 603. In addition, the lower temperature of the first stage of the two stage anneal may keep the oxygen from reacting with the trench walls and other portions of the substrate 101 to form undesirable oxide layers.

The second stage of the two stage anneal may be subsequently proceeded at the higher temperature in an environment that lacks oxygen. The second stage of the two stage anneal may rearrange the structure of the isolation material and drive out moisture, both of which increase the density of the isolation material. The environment may be, for example, substantially pure nitrogen, a mixture of nitrogen and noble gases (e.g., helium, neon, argon, or xenon), or a substantially pure noble gas. The environment may also include reducing gases such as hydrogen or ammonia. The second stage of the two stage anneal may facilitate the high-temperature densification without the oxidation of the substrate 101.

After the two stage anneal, a planarization process, such as chemical mechanical polishing, may be performed until the top surface 203TS of the liner layer 203 is exposed to remove excess material, provide a substantially flat surface for subsequent processing steps, and concurrently form the isolation layers 205.

Figure 8:
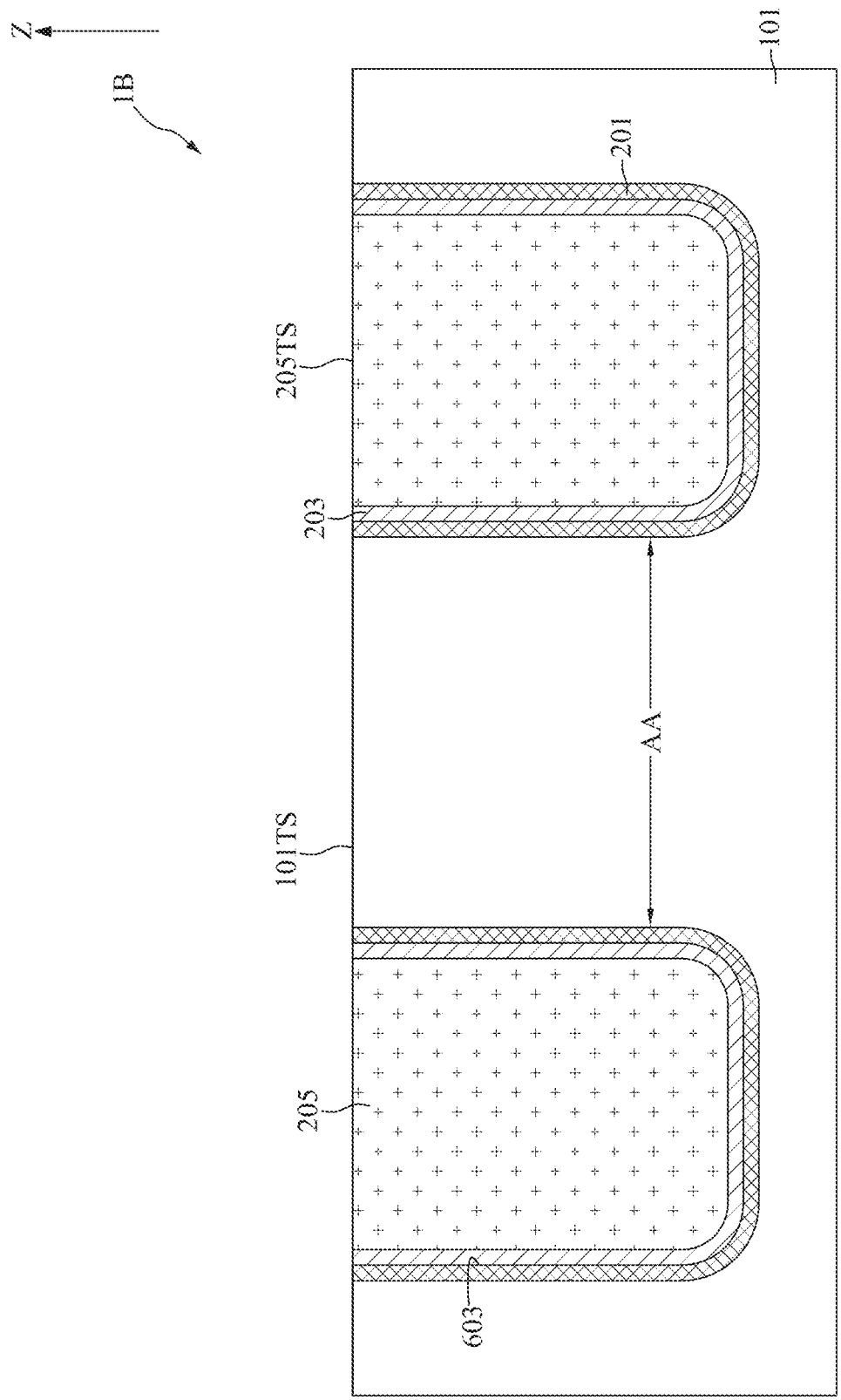
FIG. 8 illustrates, in a schematic cross-sectional view diagram, a semiconductor device in accordance with another embodiment of the present disclosure.

FIG. 8 illustrates, in a schematic cross-sectional view diagram, a semiconductor device 1B in accordance with another embodiment of the present disclosure.

With reference to FIG. 8, an intermediate semiconductor device may be fabricating with a procedure similar to that illustrated in FIGS. 2 to 7. The planarization process illustrated in FIG. 7 may be performed until the top surface 101TS of the substrate 101 is exposed to remove the pad oxide layer 103, the hard mask layer 105, the liner layer 203 formed above the top surface 101TS of the substrate 101, and the isolation layers 205 formed above the top surface 101TS of the substrate 101.

Figure 9:
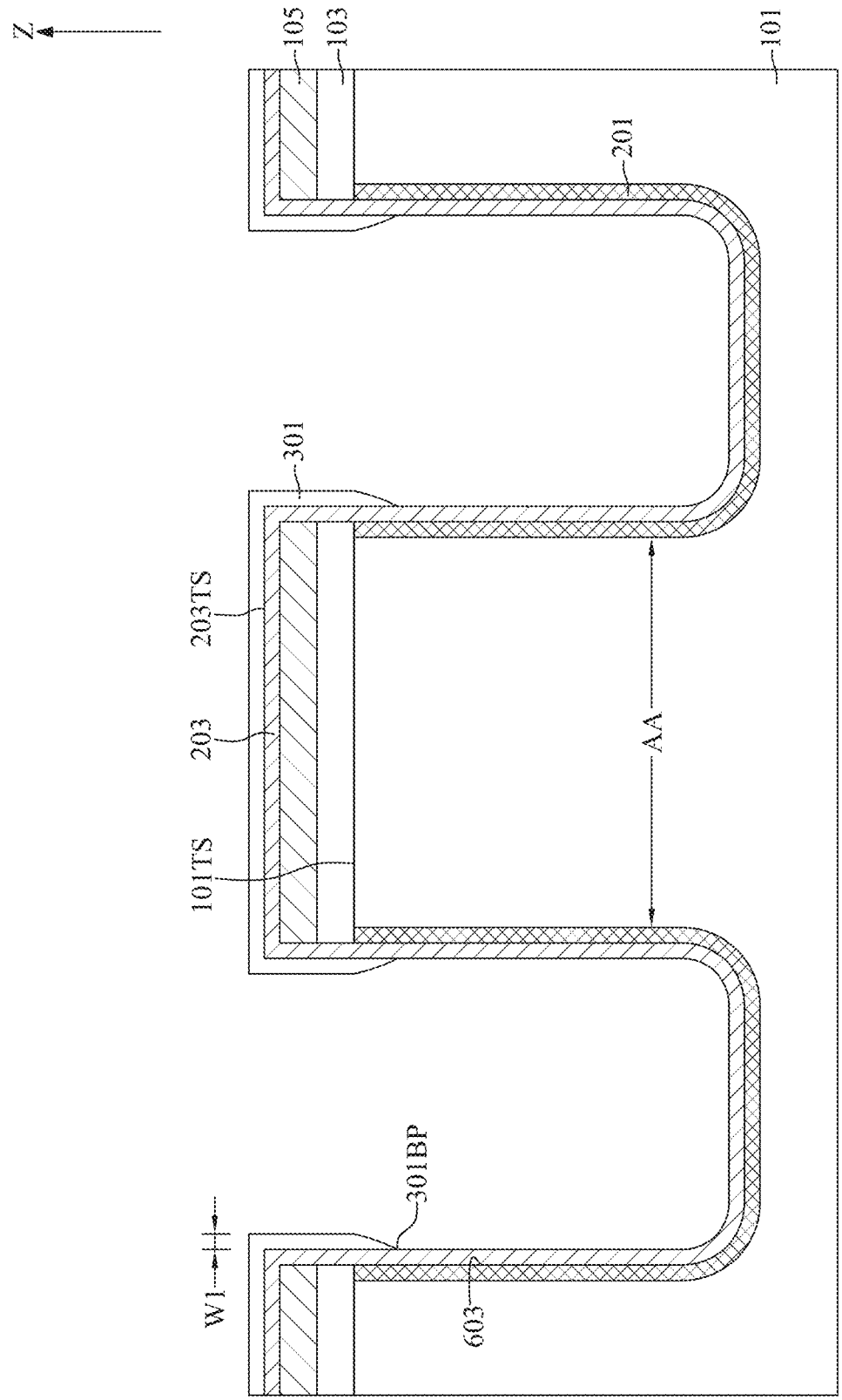
FIGS. 9 and 10 illustrate, in schematic cross-sectional view diagrams, part of a flow for fabricating a semiconductor device in accordance with another embodiment of the present disclosure.
Figure 10:
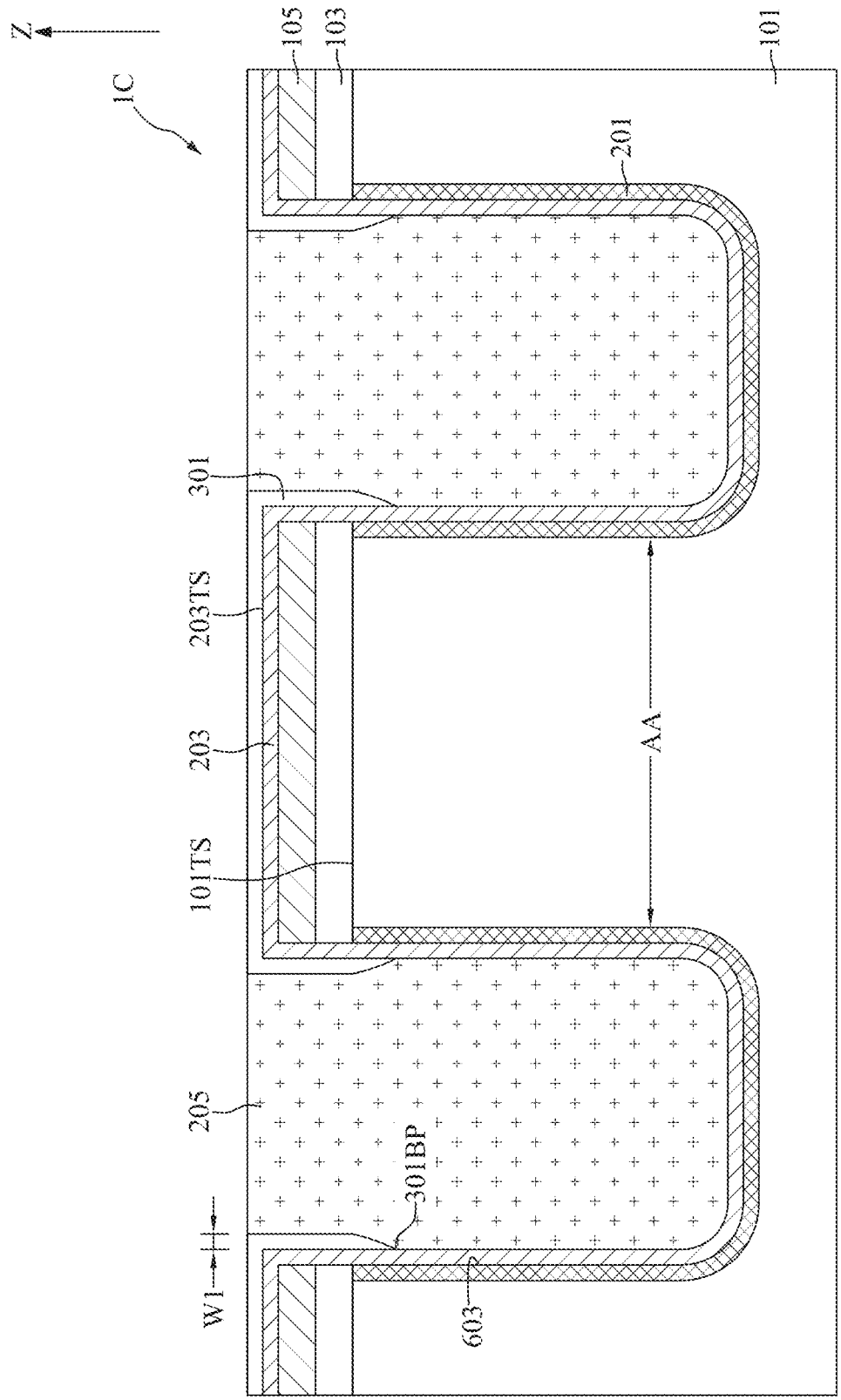

FIGS. 9 and 10 illustrate, in schematic cross-sectional view diagrams, part of a flow for fabricating a semiconductor device 1C in accordance with another embodiment of the present disclosure.

With reference to FIG. 9, an intermediate semiconductor device may be fabricating with a procedure similar to that illustrated in FIGS. 2 to 6. The covering layers 301 may be formed covering the top surface of the liner layer 203 and the upper portions of the first trenches 603. A width W1 of the covering layers 301 may gradually decrease along the direction Z from top to bottom. In some embodiments, the bottommost points 301BP of the covering layers 301 may be at a vertical level lower than a vertical level of the top surface 101TS of the substrate 101. In some embodiments, the bottommost points 301BP of the covering layers 301 may be at a vertical level equal to or higher than the vertical level of the top surface 101TS of the substrate 101.

The covering layers 301 may be formed of, for example, aluminum oxide, hafnium oxide, zirconium oxide, titanium oxide, titanium nitride, tungsten nitride, silicon nitride, or silicon oxide. The covering layers 301 may be formed by a deposition process such as an atomic layer deposition method precisely controlling an amount of a first precursor of the atomic layer deposition method.

The first precursor of the atomic layer deposition method may include trimethylaluminum, hafnium tetrachloride, hafnium tert-butoxide, hafnium dimethylamide, hafnium ethylmethylamide, hafnium diethylamide, hafnium methoxy-t-butoxide, zirconium tetrachloride, titanium tetrachloride, tetraethyl titanate, titanium isopropoxide, tungsten hexafluoride, silylene, chlorine, ammonia, dinitrogen tetrahydride, silicon tetraisocyanate, $CH_3OSi(NCO)_3$ or a combination thereof. The second precursor of the atomic layer deposition method may include water, ozone, hydrogen, or a combination thereof.

With reference to FIG. 10, procedures similar to that illustrated in FIG. 7 may be performed. Due to the presence of the covering layers 301, the deposition rate of the isolation material on the sidewalls of the first trenches 603 may be reduced. Hence, the deposition rate of the isolation material on the sidewalls of the first trenches 603 and the deposition rate of the isolation material on the bottom surfaces of the first trenches 603 may become close to each other. As a result, the first trenches 603 may be filled without any void formation near the bottom surfaces of the first trenches 603. The yield of the semiconductor device 1C may be improved.

Figure 11:
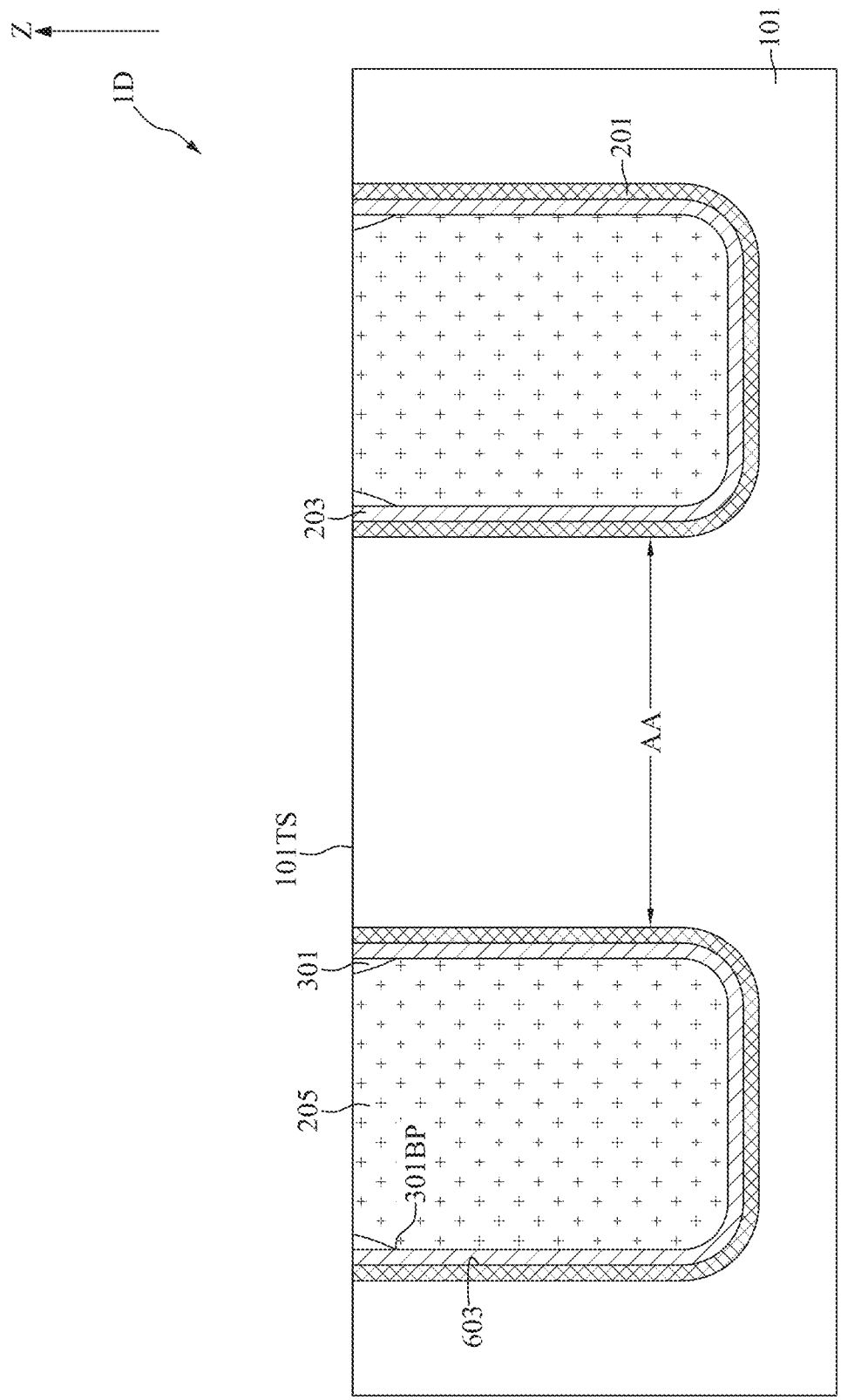
FIG. 11 illustrates, in a schematic cross-sectional view diagram, a semiconductor device in accordance with another embodiment of the present disclosure.

FIG. 11 illustrates, in a schematic cross-sectional view diagram, a semiconductor device 1D in accordance with another embodiment of the present disclosure.

With reference to FIG. 11, an intermediate semiconductor device may be fabricating with a procedure similar to that illustrated in FIGS. 9 and 10. The planarization process illustrated in FIG. 10 may be performed until the top surface 101TS of the substrate 101 is exposed to remove the pad oxide layer 103, the hard mask layer 105, the liner layer 203 formed above the top surface 101TS of the substrate 101, the isolation layers 205 formed above the top surface 101TS of the substrate 101, and the covering layers 301 formed above the top surface 101TS of the substrate 101.

Figure 12:
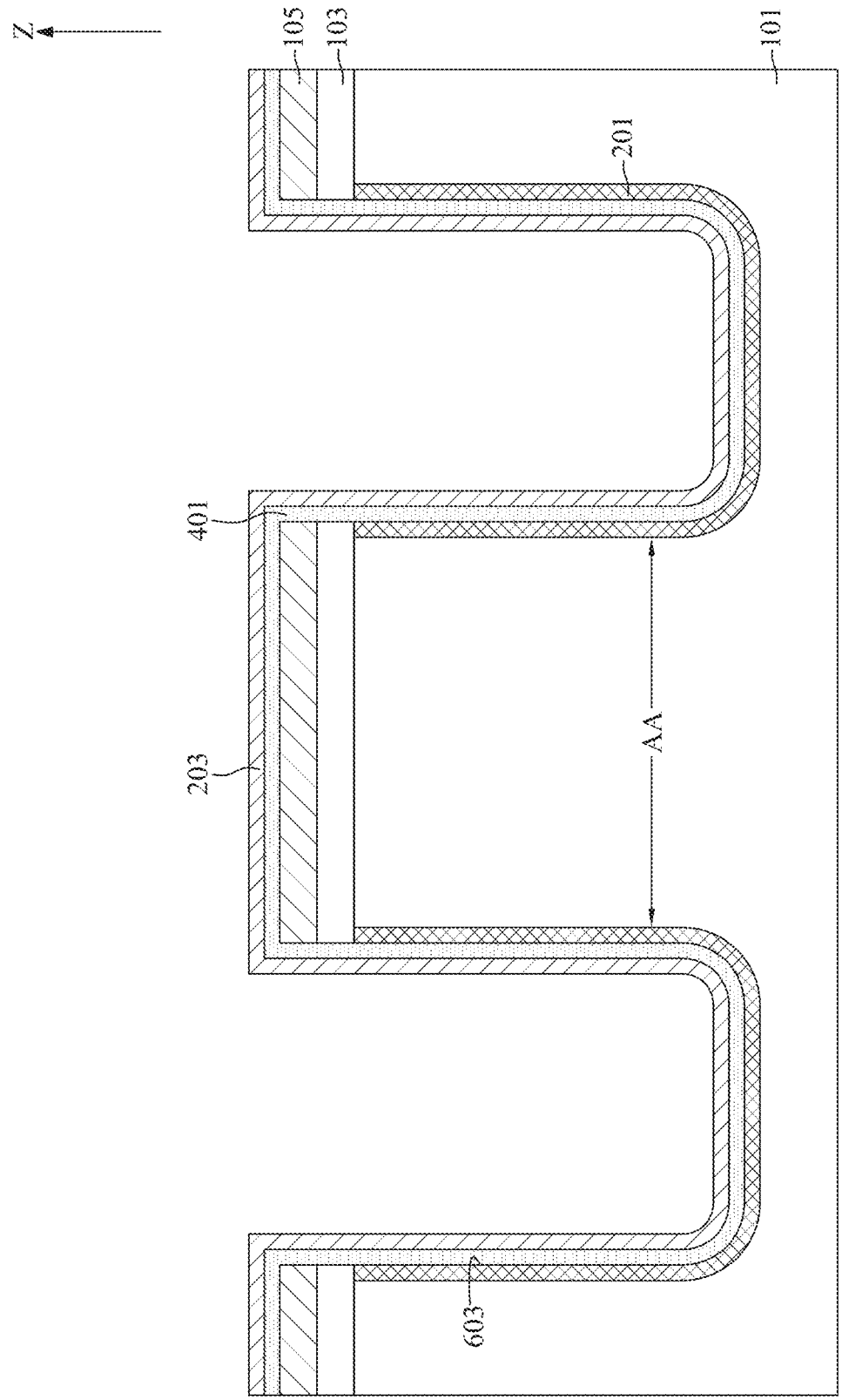
FIGS. 12 and 13 illustrate, in schematic cross-sectional view diagrams, part of a flow for fabricating a semiconductor device in accordance with another embodiment of the present disclosure.
Figure 13:
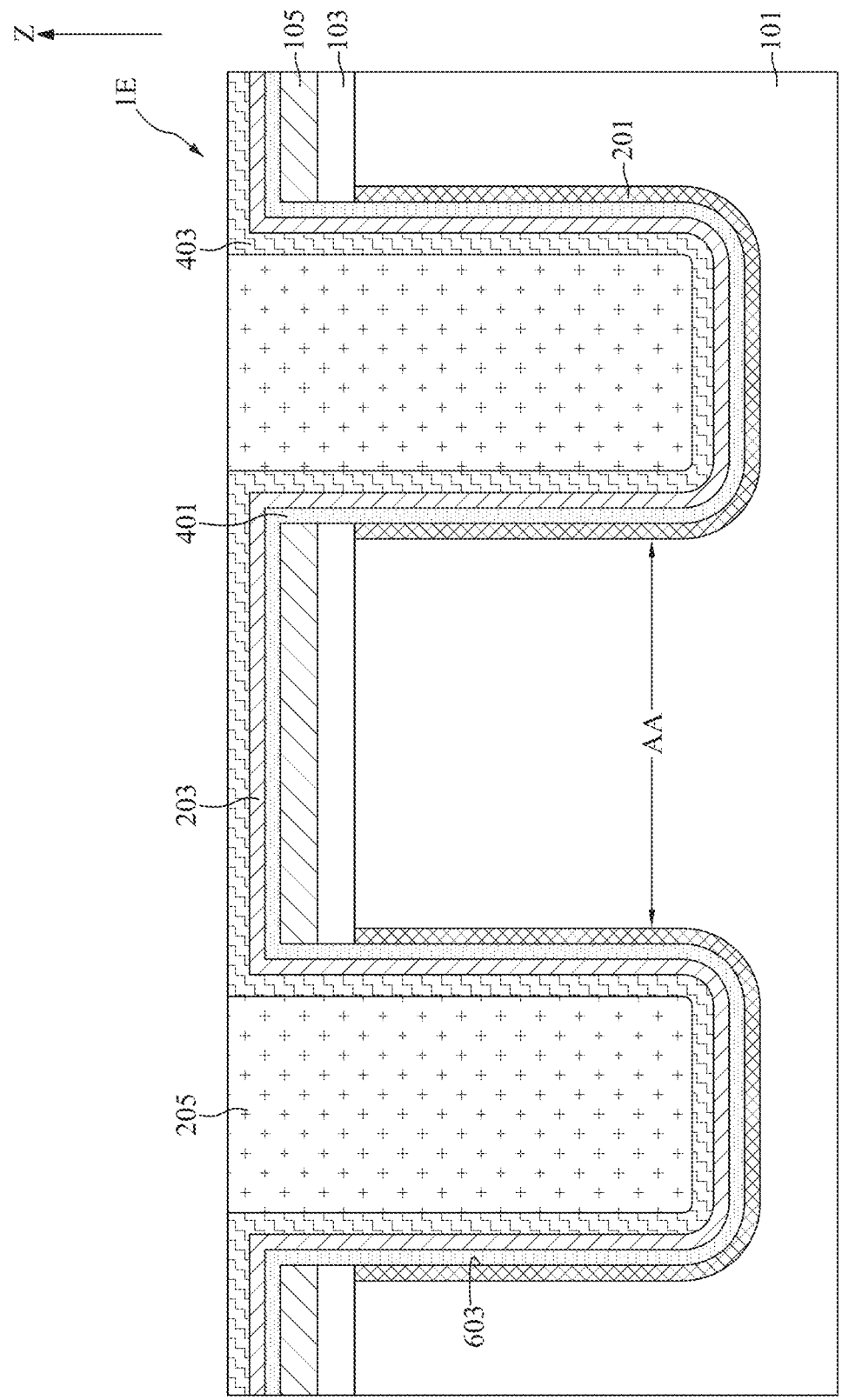

FIGS. 12 and 13 illustrate, in schematic cross-sectional view diagrams, part of a flow for fabricating a semiconductor device 1E in accordance with another embodiment of the present disclosure.

With reference to FIG. 12, an intermediate semiconductor device may be fabricating with a procedure similar to that illustrated in FIGS. 2 to 5. A first barrier layer 401 may be conformally formed in the first trenches 603 and on the top surface of the hard mask layer 105. The first barrier layer 401 may have a thickness between about 10 angstroms and about 5000 angstroms. The first barrier layer 401 may be formed of, for example, silicon nitride. The first barrier layer 401 may be formed by a deposition process such as chemical vapor deposition or atomic layer deposition. Subsequently, the liner layer 203 may be conformally formed on the first barrier layer 401. The boron within the liner layer 203 may leach out of the liner layer 203, such as diffuse to the substrate 101, and may detrimentally affect the reliability of the semiconductor device 1E. The first barrier layer 401 may serve as a physical barrier to avoid or suppress the diffusion of boron from the liner layer 203 into the substrate 101.

With reference to FIG. 13, the second barrier layer 403 may be conformally formed on the liner layer 203. The second barrier layer 403 may have a same thickness as the first barrier layer 401 but is not limited thereto. The second barrier layer 403 may be formed of a same material as the first barrier layer 401. The isolation layers 205 may be subsequently formed, with a procedure similar to that illustrated in FIG. 7, on the second barrier layer 403 and filling the first trenches 603. The second barrier layer 403 may serve as a physical barrier to avoid or suppress the diffusion of boron from the liner layer 203 into the isolation layers 205. The planarization process may be performed until the top surface of the second barrier layer 403 is exposed.

Figure 14:
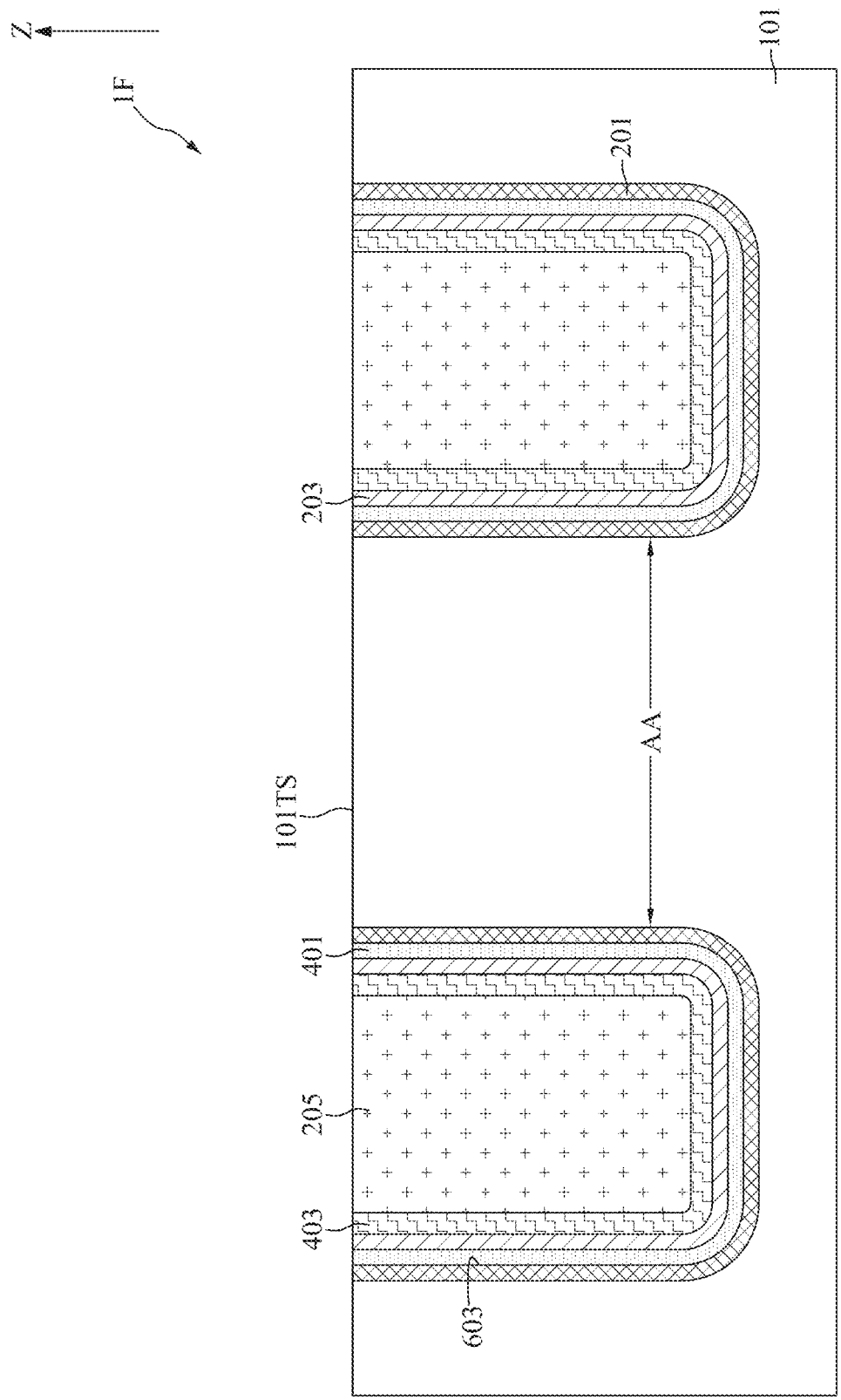
FIG. 14 illustrates, in a schematic cross-sectional view diagram, a semiconductor device in accordance with another embodiment of the present disclosure.

FIG. 14 illustrates, in a schematic cross-sectional view diagram, a semiconductor device 1F in accordance with another embodiment of the present disclosure.

With reference to FIG. 14, an intermediate semiconductor device may be fabricating with a procedure similar to that illustrated in FIGS. 12 and 13. The planarization process illustrated in FIG. 13 may be performed until the top surface 101TS of the substrate 101 is exposed to remove the pad oxide layer 103, the hard mask layer 105, the liner layer 203 formed above the top surface 101TS of the substrate 101, the isolation layers 205 formed above the top surface 101TS of the substrate 101, the first barrier layer 401 formed above the top surface 101TS of the substrate 101, and the second barrier layer 403 formed above the top surface 101TS of the substrate 101.

FIGS. 15 to 18 illustrate, in schematic cross-sectional view diagrams, part of a flow for fabricating a semiconductor device 1G in accordance with another embodiment of the present disclosure.

Figure 15:
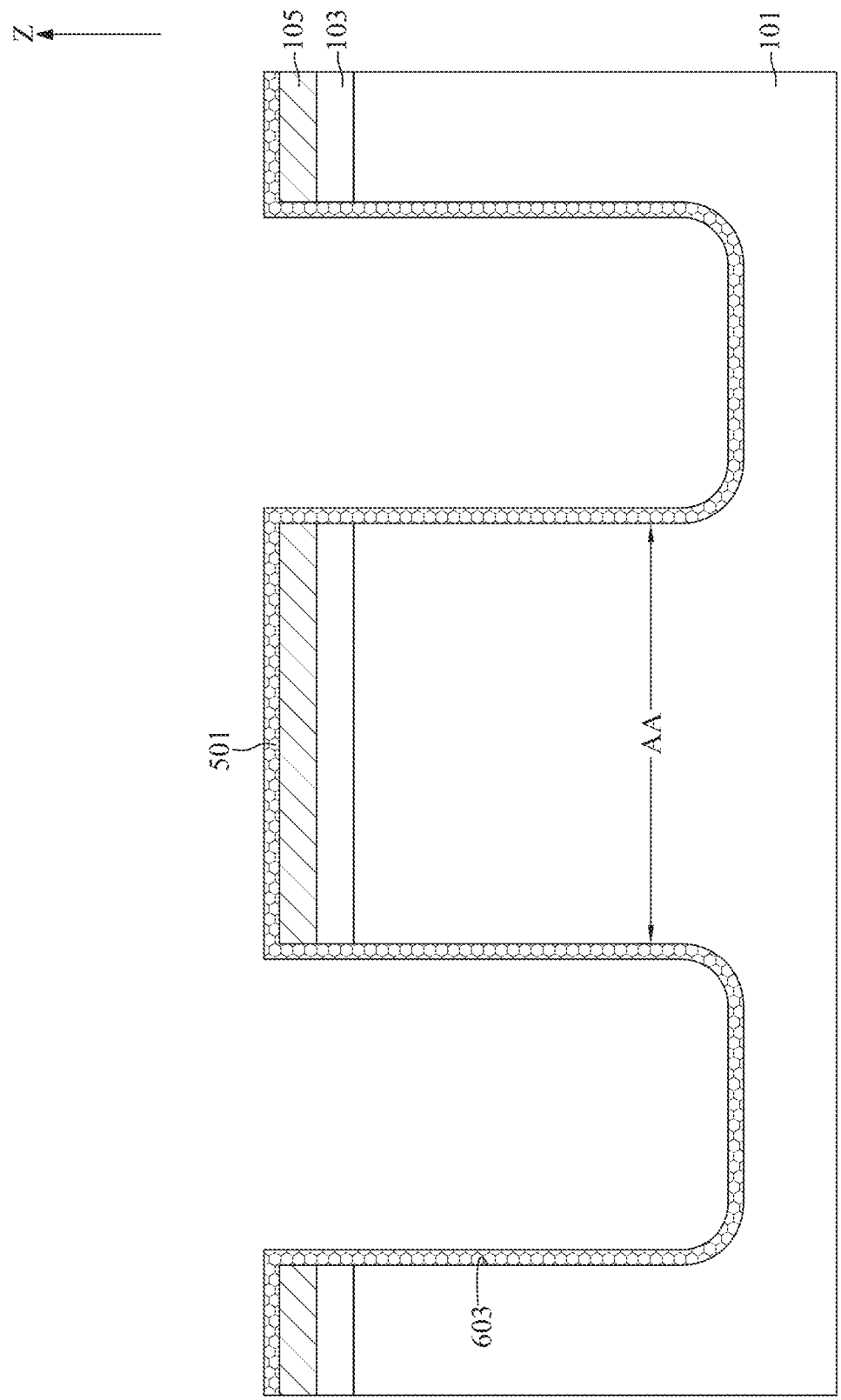
FIGS. 15 to 18 illustrate, in schematic cross-sectional view diagrams, part of a flow for fabricating a semiconductor device in accordance with another embodiment of the present disclosure.
Figure 16:
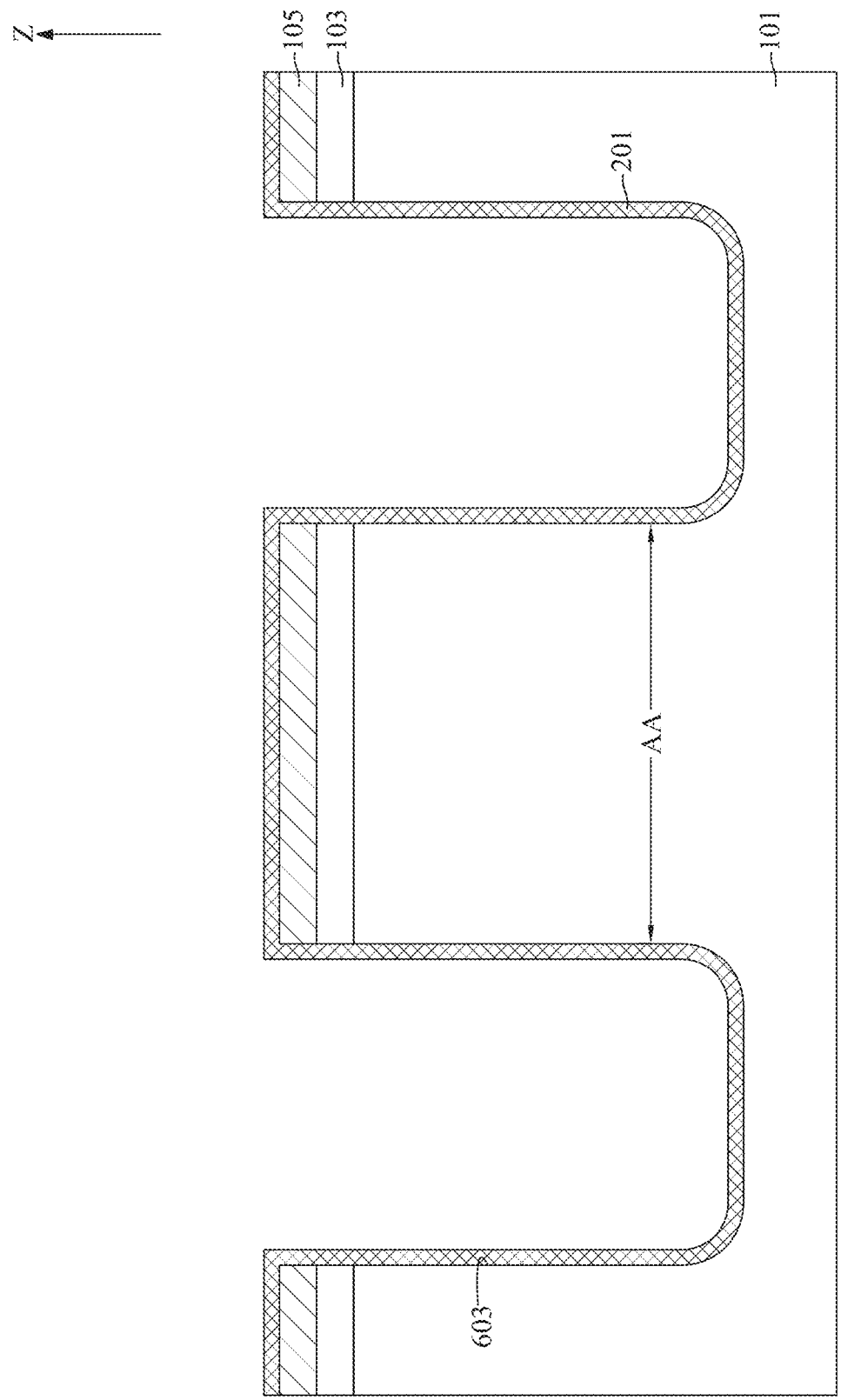

With reference to FIGS. 15 and 16, an intermediate semiconductor device may be fabricating with a procedure similar to that illustrated in FIGS. 2 to 4. A flowable layer 501 may be conformally formed in the first trenches 603 and on the top surface of the hard mask layer 105 as in FIG. 15. Subsequently, the flowable layer 501 may be turned into the first dielectric layer 201 as in FIG. 16.

In some embodiments, the flowable layer 501 may include compounds having unsaturated bonding such as double bonds and triple bonds. The flowable layer 501 may be characterized as a soft jelly-like layer, a gel having liquid flow characteristics, or a liquid layer but is not limited thereto. The flowable layer 501 may flow into and fill small substrate gaps without forming voids or weak seams. A thermal process may be subsequently performed to transform the flowable layer 501 into the first dielectric layer 201 by solidifying the flowable layer 501. The thermal process may break the unsaturated bonding into radicals, and the compounds may cross-link through the radicals. As a result, the flowable layer 501 may be solidified. In some embodiments, the volume of the flowable layer 501 may be reduced during the thermal process. Hence, the first dielectric layer 201 may have greater density comparing to the flowable layer 501. The first dielectric layer 201 may be located at the position where the flowable layer 501 previously occupied. In other words, the first dielectric layer 201 may be conformally disposed in the first trenches 603 and on the top surface of the hard mask layer 105.

Alternatively, in some embodiments, the flowable layer 501 may be a flowable silicon-and-nitrogen containing layer. The flowable silicon-and-nitrogen containing layer may be formed by mixing a carbon-free silicon-containing precursor with a radical-nitrogen precursor. The flowable nature of the flowable silicon-and-nitrogen containing layer may allow the flowable silicon-and-nitrogen containing layer to flow into narrow substrate gaps or narrow trenches. The temperature of the substrate 101 during the formation of the flowable silicon-and-nitrogen containing layer may be less than 120° C., less than 100° C., less than 80° C., or less than 60° C.

The carbon-free silicon-containing precursor may be, for example, a silicon-and-nitrogen precursor, a silicon-and-hydrogen precursor, or a silicon-nitrogen-and-hydrogen-containing precursor. In some embodiments, the carbon-free silicon-containing precursor may be also oxygen-free. The lack of oxygen results in a lower concentration of silanol (Si—OH) groups in the flowable silicon-and-nitrogen containing layer formed from the carbon-free silicon-containing precursor. Excess silanol moieties in the flowable siliconand-nitrogen containing layer may cause increased porosity and shrinkage during subsequent processing that remove the hydroxyl (—OH) moieties from the flowable silicon-and-nitrogen containing layer.

In some embodiments, the carbon-free silicon-containing precursor may include silyl-amines such as $H_2N(SiH_3)$, $HN(SiH_3)_2$, and $N(SiH_3)_3$. The flow rates of a silyl-amines may be greater than or about 200 sccm, greater than or about 300 sccm, or greater than or about 500 sccm. These silyl-amines may be mixed with additional gases that may act as carrier gases, reactive gases, or both. Examples of these additional gases may include $H_2$, $N_2$, $NH_3$, He, and Ar.

In some embodiments, the carbon-free silicon-containing precursor may include silane either alone or mixed with other silicon (e.g., $N(SiH_3)_3$), hydrogen (e.g., $H_2$), and/or nitrogen (e.g., $N_2$, $NH_3$) containing gases.

In some embodiments, the carbon-free silicon-containing precursor may include disilane, trisilane, even higher-order silanes, and chlorinated silanes, alone or in combination with silyl-amines.

The radical-nitrogen precursor may be generated by delivering ammonia to a plasma region. The radical-nitrogen precursor may be subsequently delivered to mix with the carbon-free silicon-containing precursor. The flow rate of delivering ammonia to the plasma region may be greater than or about 300 sccm, greater than or about 500 sccm, or greater than or about 700 sccm. In some embodiments, gases such as nitrogen and hydrogen may be employed to adjust the nitrogen:hydrogen atomic flow ratio. In some embodiments, gases such as helium or argon may be employed as carrier gas for delivering ammonia to the plasma region.

In some embodiments, the radical-nitrogen precursor may be produced without using ammonia. Gases include one or more of hydrogen, nitrogen and hydrazine may be delivered to the plasma region to generate the radical-nitrogen precursor.

Subsequently, a cure process and an anneal process may be sequentially applied to the flowable silicon-and-nitrogen containing layer (i.e., the flowable layer 501) in an oxygen-containing atmosphere to convert the flowable silicon-and-nitrogen containing layer into the first dielectric layer 201 formed of silicon oxide. In some embodiments, the substrate temperature of the cure process may be below or about 400° C. For example, the substrate temperature of the cure process may be between about 100° C. and about 200° C. In some embodiments, the substrate temperature of the anneal process may be between about 500° C. and about 1100° C. In some embodiments, the oxygen-containing atmosphere may include one or more oxygen-containing gases such as molecular oxygen, ozone, water vapor, hydrogen peroxide, and nitrogen-oxides (e.g., nitric oxide, nitrous oxide, etc.).

Alternatively, in some embodiments, the flowable layer 501 may be formed by reacting vapor phase precursors with co-reactants. The flowable layer 501 may have flow characteristics that can provide consistent fill of substrate gaps of the substrate 101. Subsequently, a post-deposition treatment may be performed, and the flowable layer 501 may be physically densified and/or chemically converted to reduce its flowability. After the post-deposition treatment, the flowable layer 501 may be turned into the first dielectric layer 201. In some embodiments, the densified flowable layer 501 may be considered to be solidified. In some embodiments, physically densifying the flowable layer 501 may involve shrinking the flowable layer 501. In some embodiments, the post-deposition treatment may involve substituting chemicals in the flowable layer 501, which may result in denser, higher volume first dielectric layer 201.

In some embodiments, the flowable layer 501 may be flowable silicon oxide, silicon nitride, or silicon oxynitride. In some embodiments, the flowable layer 501 may be silicon carbide or silicon oxycarbide. In some embodiments, chamber pressure for formation of the flowable layer 501 may be between about 1 and 200 Torr, between 10 and 75 Torr, or about 10 Torr. In some embodiments, substrate temperature for formation of the flowable layer 501 may be between about −20° C. and about 100° C., between about −20° C. and 30° C., or between about −10° C. and about 10° C.

In some embodiments, the vapor phase precursors may include silicon containing precursors or carbon containing precursors. The co-reactants may include oxidants, catalyst, surfactants, or inert carrier gases.

The silicon containing precursors may include, but are not limited to, silane, disilane, trisilane, hexasilane, cyclohexasilane, alkoxysilanes, aminosilanes, alkylsilanes, tetraisocyanatesilane (TICS), hydrogen silsesquioxane, T8-hydridospherosiloxane, or 1,2-dimethoxy-1,1,2,2-tetramethyldisilane.

The alkoxysilanes may include tetraoxymethylcyclotetrasiloxane (TOMCTS), octamethylcyclotetrasiloxane (OMCTS), tetraethoxysilane (TEOS), triethoxysilane (TES), trimethoxysilane (TriMOS), methyltriethoxyorthosilicate (MTEOS), tetramethylorthosilicate (TMOS), methyltrimethoxysilane (MTMOS), dimethyldimethoxysilane (DMDMOS), diethoxysilane (DES), dimethoxysilane (DMOS), triphenylethoxysilane, 1-(triethoxysilyl)-2-(diethoxymethylsilyl)ethane, tri-t-butoxylsilanol, hexamethoxydisilane (HMODS), hexaethoxydisilane (HEODS), or tert-butoxydisilane. The aminosilanes may include bis-tert-butylamino silane (BTBAS) or tris(dimethylamino)silane.

The carbon containing precursors may include, but are not limited to, trimethylsilane (3MS), tetramethylsilane (4MS), diethoxymethylsilane (DEMS), dimethyldimethoxysilane, methyl-triethoxysilane (MTES), methyl-trimethoxysilane, methyl-diethoxysilane, methyl-dimethoxysilane, trimethoxymethylsilane, dimethoxymethylsilane, or bis(trimethylsilyl)carbodiimide.

The oxidants may include, but are not limited to, ozone, hydrogen peroxide, oxygen, water, alcohols, nitric oxide, nitrous dioxide, nitrous oxide, carbon monoxide, or carbon dioxide. The alcohols may include, for example, methanol, ethanol, or isopropanol.

The catalyst may include, but are not limited to, proton donor catalyst, halogen-containing compounds, mineral acids, bases, chloro-diethoxysilane, methanesulfonic acid, trifluoromethanesulfonic acid, chloro-dimethoxysilane, pyridine, acetyl chloride, chloroacetic acid, dichloroacetic acid, trichloroacetic acid, oxalic acid, benzoic acid, or triethylamine. The proton donor catalyst may include nitric acid, hydrofluoric acid, phosphoric acid, sulphuric acid, hydrochloric acid, bromic acid, carboxylic acid derivatives, ammonia, ammonium hydroxide, hydrazine, or hydroxylamine. The halogen-containing compounds may include dichlorosilane, trichlorosilane, methylchlorosilane, chlorotriethoxysilane, chlorotrimethoxysilane, chloromethyldiethoxysilane, chloromethyldimethoxysilane, vinyltrichlorosilane, diethoxydichlorosilane, or hexachlorodisiloxane. The mineral acids may include formic acid or acetic acid. The bases may include phosphine.

The surfactants may include solvents, alcohols, ethylene glycol, or polyethylene glycol. The surfactants may be used to relieve surface tension and increase wetting of reactants on the substrate surface. The surfactants may also increase the miscibility of the vapor phase precursors with the other reactants.

The solvents may be non-polar or polar and protic or aprotic. The solvents may be matched to the choice of vapor phase precursors to improve the miscibility in the oxidants. Non-polar solvents may include alkanes and alkenes; polar aprotic solvents may include acetones and acetates; and polar protic solvents may include alcohols and carboxylic compounds.

Examples of solvents include, but not limited to, methanol, ethanol, isopropanol, acetone, diethylether, acetonitrile, dimethylformamide, dimethyl sulfoxide, tetrahydrofuran, dichloromethane, hexane, benzene, toluene, isoheptane and diethylether. In some embodiments, the solvents may be introduced prior to the other reactants.

The inert carrier gases may include nitrogen, helium, or argon.

The post-deposition treatment may cross-link and remove terminal groups such as OH and H groups in the flowable layer 501, therefore increase the density and hardness of the flowable layer 501. The post-deposition treatment may be thermal curing, exposure to a downstream or direct plasma, exposure to ultraviolet or microwave radiation, or exposure to another energy source.

While using thermal curing as the means of the post-deposition treatment, the temperature of thermal curing may be between about 200° C. and 600° C. The post-deposition treatment may be performed in an inert environment, an oxidizing environment, a nitridizing environment, or a mix of oxidizing and nitridizing environment. The inert environment may include argon or helium. The oxidizing environment may include oxygen, ozone, water, hydrogen peroxide, nitrous oxide, nitric oxide, nitrogen dioxide, carbon monoxide, carbon dioxide. The nitridizing environment may include nitrogen, ammonia, nitrous oxide, nitric oxide, nitrogen dioxide. The pressure of thermal curing may be between about 0.1 Torr and about 10 Torr.

While using the exposure to a downstream or direct plasma as the means of the post-deposition treatment, the plasma may be an inert plasma or a reactive plasma. The inert plasma may be helium and argon plasma. The reactive plasma may be oxidizing plasma including oxygen and steam, or hydrogen-containing plasma including hydrogen and a diluent such as inert gas. In some embodiments, the temperature during plasma exposure may be about 25° C. or higher. In some embodiments, the temperature during plasma exposure may be between about −15° C. and about 25° C.

Figure 17:
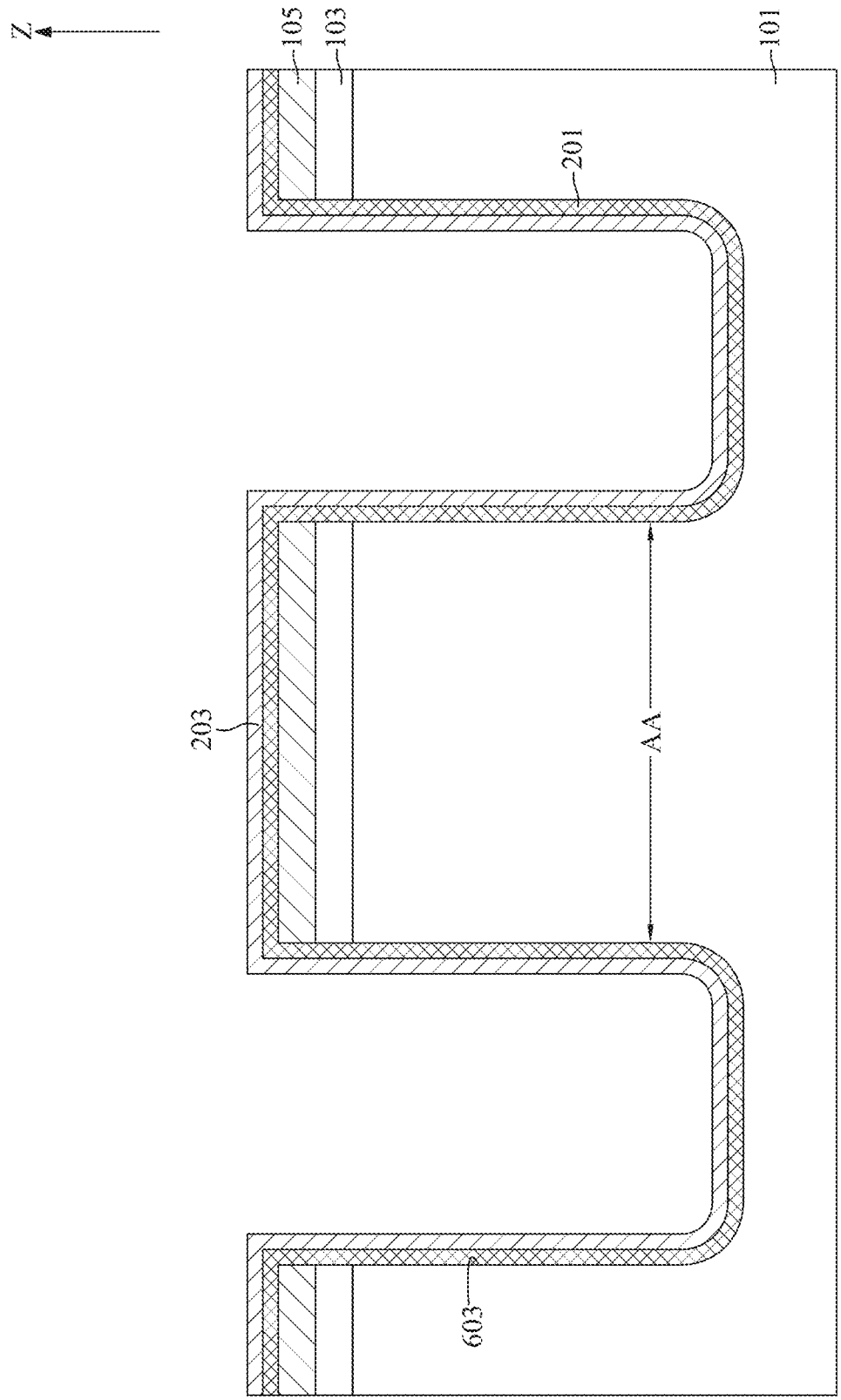

With reference to FIG. 17, the liner layer 203 may be conformally formed on the first dielectric layer 201 with a procedure similar to the hard mask layer 105 illustrated in FIG. 2.

Figure 18:
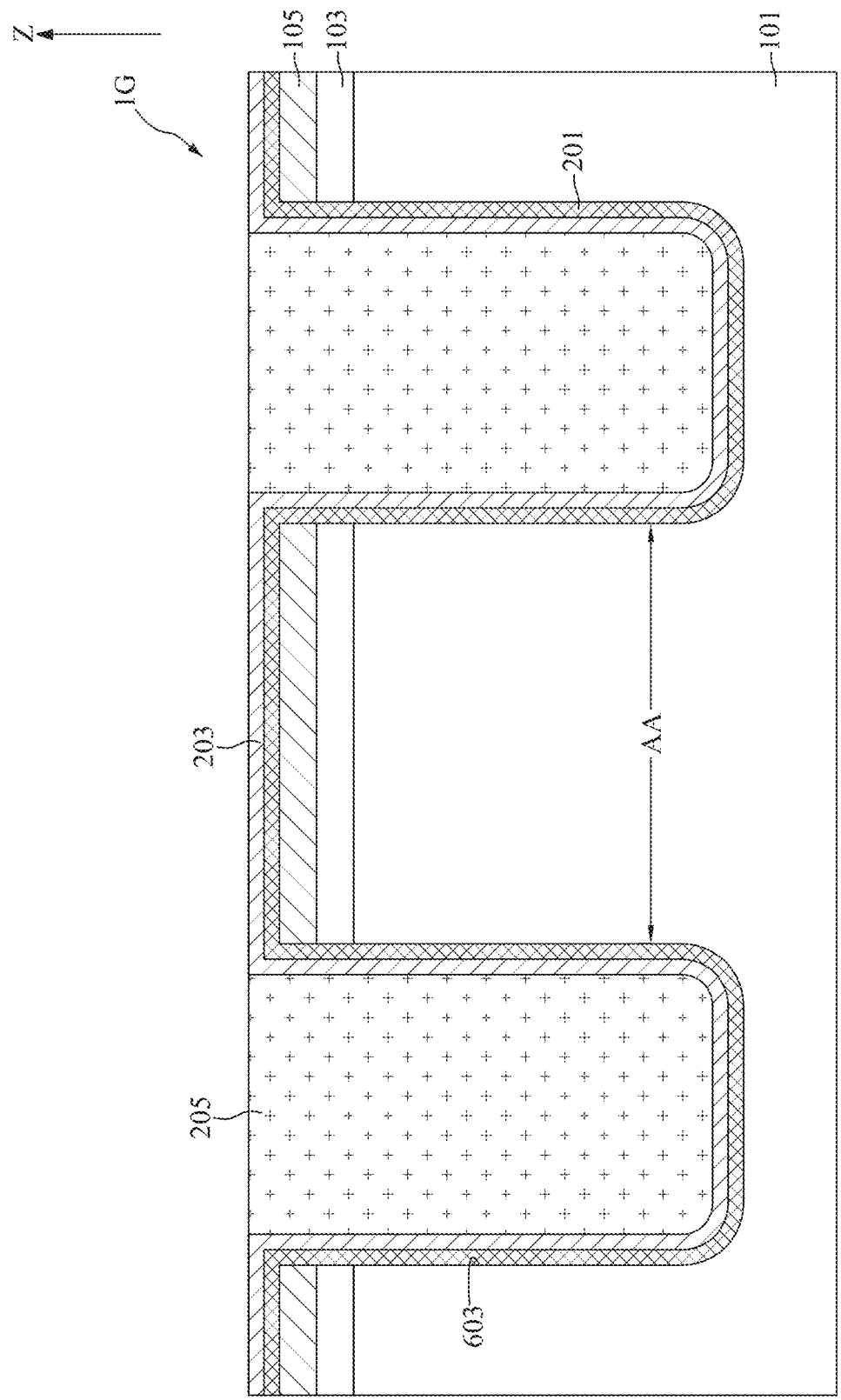

With reference to FIG. 18, the isolation layers 205 may be formed on the liner layer 203 and filling the first trenches 603 with a procedure similar to that illustrated in FIG. 7. The planarization process may be performed to remove excess material until the top surface of the liner layer 203 is exposed.

Figure 19:
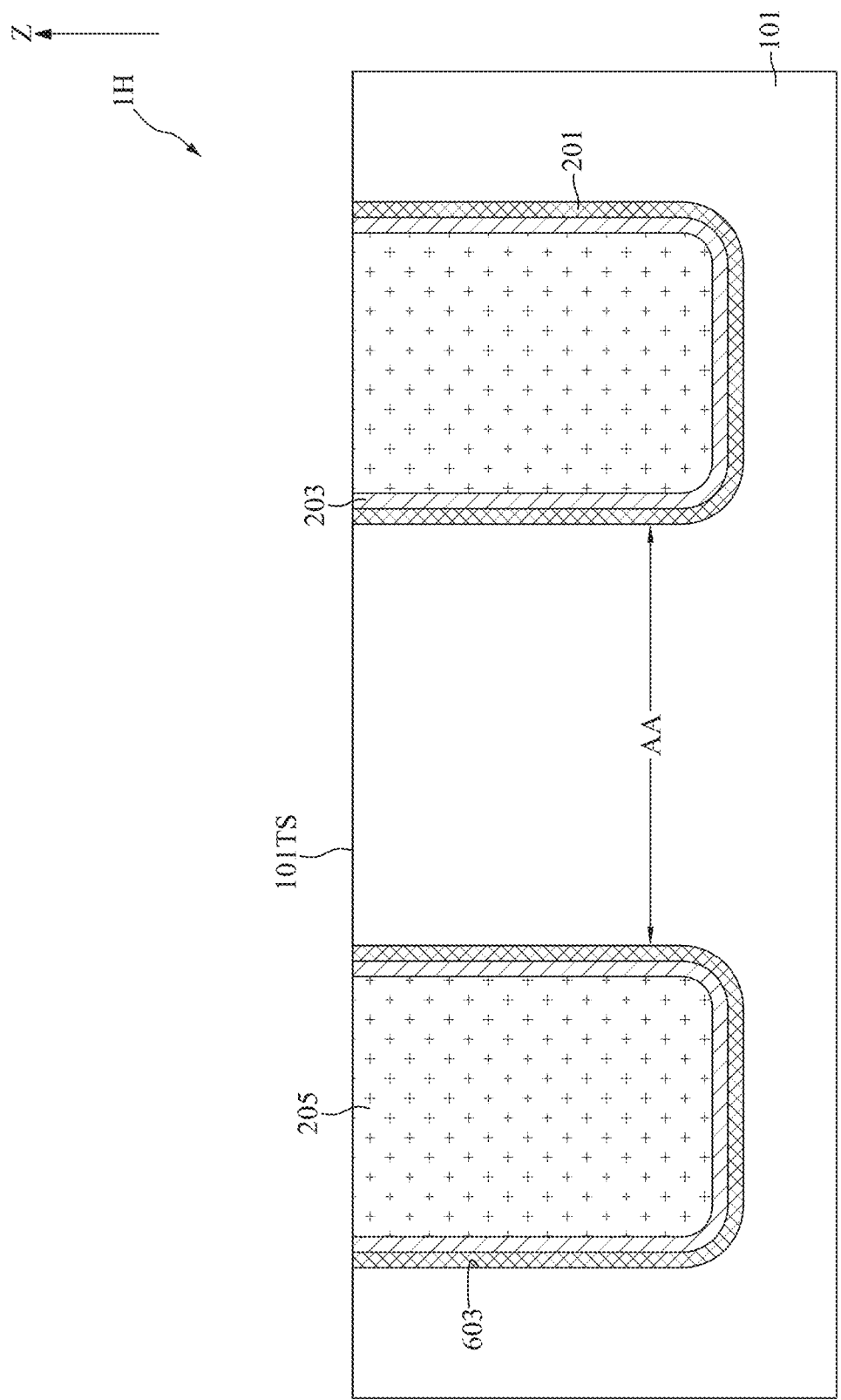
FIG. 19 illustrates, in a schematic cross-sectional view diagram, a semiconductor device in accordance with another embodiment of the present disclosure.

FIG. 19 illustrates, in a schematic cross-sectional view diagram, a semiconductor device 1H in accordance with another embodiment of the present disclosure.

With reference to FIG. 19, an intermediate semiconductor device may be fabricating with a procedure similar to that illustrated in FIGS. 15 to 18. The planarization process illustrated in FIG. 18 may be performed until the top surface 101TS of the substrate 101 is exposed to remove the pad oxide layer 103, the hard mask layer 105, the liner layer 203 formed above the top surface 101TS of the substrate 101, and the isolation layers 205 formed above the top surface 101TS of the substrate 101.

One aspect of the present disclosure provides a semiconductor device including a substrate, a pad oxide layer positioned on the substrate, a hard mask layer positioned on the pad oxide layer, an isolation layer positioned along the hard mask layer and the pad oxide layer and extending to the substrate, a first dielectric layer positioned between the substrate and the isolation layer, and a liner layer positioned on a top surface of the hard mask layer and positioned between the first dielectric layer and the isolation layer, between the pad oxide layer and the isolation layer, and between the hard mask layer and the isolation layer. The hard mask layer and the liner layer include boron nitride.

Another aspect of the present disclosure provides a semiconductor device including a substrate, an isolation layer positioned in the substrate, a first dielectric layer positioned between the substrate and the isolation layer, and a liner layer positioned between the first dielectric layer and the isolation layer. A top surface of the isolation layer is substantially coplanar with a top surface of the substrate and the liner layer includes boron nitride.

Another aspect of the present disclosure provides a method for fabricating a semiconductor device including providing a substrate, forming a pad oxide layer on the substrate, forming a hard mask layer on the pad oxide layer, forming a first trench along the hard mask layer and the pad oxide layer and extending to the substrate, conformally forming a first dielectric layer in the first trench, conformally forming a liner layer on the first dielectric layer, and forming an isolation layer on the liner layer. The hard mask layer and the liner layer include boron nitride.

Due to the design of the semiconductor device of the present disclosure, the hard mask layer 105 may be employed as an anti-reflection coating to improve the quality of patterning. Accordingly, the quality of the semiconductor device 1A may be improved. In addition, the isolation layer 205 may be formed without any void due to the presence of the covering layers 301. As a result, the reliability of the semiconductor device 1C may be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
   a substrate;

a pad oxide layer positioned on the substrate;

a hard mask layer positioned on the pad oxide layer;

an isolation layer positioned along the hard mask layer and the pad oxide layer and extending to the substrate;

a first dielectric layer positioned between the substrate and the isolation layer;

a liner layer positioned on a top surface of the hard mask layer and positioned between the first dielectric layer and the isolation layer, between the pad oxide layer and the isolation layer, and between the hard mask layer and the isolation layer; and covering layers positioned on a top surface of the liner layer and positioned between the isolation layer and the liner layer, wherein bottommost points of the covering layers are at a vertical level lower than a vertical level of a top surface of the substrate;

wherein the hard mask layer and the liner layer comprise boron nitride;

wherein a thickness of the hard mask layer is between about 1 nm and about 10 nm;

wherein a thickness of the liner layer is between about 1 nm and about 10 nm.

2. The semiconductor device of claim 1, wherein a width of the covering layers gradually decreases from top to bottom.

3. The semiconductor device of claim/wherein the covering layers are formed of aluminum oxide, hafnium oxide, zirconium oxide, titanium oxide, titanium nitride, tungsten nitride, silicon nitride, or silicon oxide.

4. The semiconductor device of claim 1, further comprising a first barrier layer positioned between the first dielectric layer and the liner layer.

5. The semiconductor device of claim 4, further comprising a second barrier layer positioned between the liner layer and the isolation layer.

6. The semiconductor device of claim 5, wherein the first barrier layer and the second barrier layer are formed of silicon nitride.

7. A semiconductor device, comprising:

a substrate;

an isolation layer positioned in the substrate;

a first dielectric layer positioned between the substrate and the isolation layer; and a liner layer positioned between the first dielectric layer and the isolation layer;

covering layers positioned on a top surface of the liner layer and positioned between the isolation layer and the liner layer, wherein bottommost points of the covering layers are at a vertical level lower than a vertical level of a top surface of the substrate;

wherein a top surface of the isolation layer is substantially coplanar with a top surface of the substrate and the liner layer comprises boron nitride.

8. A method for fabricating a semiconductor device, comprising:

providing a substrate;

forming a pad oxide layer on the substrate;

forming a hard mask layer on the pad oxide layer, wherein the step of forming the hard mask layer on the pad oxide layer comprises:

forming a boron-based layer on the pad oxide layer by a film formation process using first precursors; and turning the boron-based layer into the hard mask layer by reacting second precursors with the boron-based layer in a treatment process;

wherein the first precursors are diborane, borazine, or an alkyl-substituted derivative of borazine;

forming a first trench along the hard mask layer and the pad oxide layer and extending to the substrate;

conformally forming a first dielectric layer in the first trench;

conformally forming a liner layer on the first dielectric layer; and forming an isolation layer on the liner layer;

wherein the hard mask layer and the liner layer comprise boron nitride;

wherein the treatment process comprises introducing silicon-based precursors with the second precursors to react with the boron-based layer and the silicon-based precursors are silane, trisilylamine, trimethylsilane, and silazanes.

9. The method for fabricating the semiconductor device of claim 8, wherein the second precursors are ammonia or hydrazine.

10. The method for fabricating the semiconductor device of claim 9, wherein a process pressure of the film formation process is between about 10 mTorr and about 760 Torr.

11. The method for fabricating the semiconductor device of claim 10, wherein a substrate temperature of the film formation process is between about 100° C. and about 1000° C.

12. The method for fabricating the semiconductor device of claim 11, wherein the film formation process is performed with plasma, the plasma is provided by a RF power between 30 W and 1000 W.

13. The method for fabricating the semiconductor device of claim 8, wherein the treatment process comprises introducing phosphorus-based precursors with the second precursors to react with the boron-based layer and the phosphorus-based precursors are phosphine.

14. The method for fabricating the semiconductor device of claim 8, wherein the treatment process comprises introducing oxygen-based precursors with the second precursors to react with the boron-based layer and the oxygen-based precursors are oxygen, nitric oxide, nitrous oxide, carbon dioxide, or water.

* * * * *